(12) United States Patent
Kojima

(10) Patent No.: US 9,708,492 B2
(45) Date of Patent: Jul. 18, 2017

(54) LED DEVICE AND COATING LIQUID USED FOR PRODUCTION OF SAME

(71) Applicant: Konica Minolta Inc., Tokyo (JP)

(72) Inventor: Takeshi Kojima, Hachioji (JP)

(73) Assignee: KONICA MINOLTA, INC., Tokyo (JP)

( * ) Notice: Subject to any disclaimer, the term of this patent is extended or adjusted under 35 U.S.C. 154(b) by 256 days.

(21) Appl. No.: 14/759,095

(22) PCT Filed: Jan. 10, 2014

(86) PCT No.: PCT/JP2014/000090
§ 371 (c)(1),
(2) Date: Jul. 2, 2015

(87) PCT Pub. No.: WO2014/109293
PCT Pub. Date: Jul. 17, 2014

(65) Prior Publication Data
US 2015/0353740 A1  Dec. 10, 2015

(30) Foreign Application Priority Data

Jan. 10, 2013 (JP) .................................. 2013-002568

(51) Int. Cl.
| | | |
|---|---|---|
| C08K 3/22 | (2006.01) | |
| C09D 5/33 | (2006.01) | |
| F21V 7/22 | (2006.01) | |
| F21V 7/00 | (2006.01) | |
| F21V 19/00 | (2006.01) | |
| H01L 33/46 | (2010.01) | |
| C09D 183/04 | (2006.01) | |
| H01L 33/60 | (2010.01) | |
| C08K 3/30 | (2006.01) | |

(Continued)

(52) U.S. Cl.
CPC ............... *C09D 5/004* (2013.01); *C08K 3/22* (2013.01); *C09D 183/04* (2013.01);
(Continued)

(58) Field of Classification Search
None
See application file for complete search history.

(56) References Cited

U.S. PATENT DOCUMENTS

2005/0158566 A1* 7/2005 Higuchi ................ C08G 77/06
   428/447
2010/0081748 A1* 4/2010 Taguchi ................ C08L 83/04
   524/433

(Continued)

FOREIGN PATENT DOCUMENTS

| JP | 2005136379 A | 5/2005 |
|---|---|---|
| JP | 2005200546 A | 7/2005 |

(Continued)

OTHER PUBLICATIONS

International Search Report dated Feb. 10, 2014 for PCT/JP2014/000090 and English translation.

*Primary Examiner* — Robert S Loewe
(74) *Attorney, Agent, or Firm* — Lucas & Mercanti, LLP

(57) ABSTRACT

The present invention provides: an LED device from which light can be efficiently extracted for a long period of time because of less degradation of a reflective layer for reflecting light emitted from an LED element or the like; and a coating liquid that is used for the production of the LED device. The LED device includes a substrate, an LED element disposed on the substrate, a reflective layer disposed at least around the LED element on the substrate, wherein the reflective layer contains a white pigment and a polysiloxane, the rate of decrease in reflectance of light with a wavelength of 500 nm of the reflective layer after storage of the reflective layer at 180° C. for 1,000 hours is 10% or less of the reflectance before storage at 180° C., and the reflective layer has no glass transition point in the range of from −70° C. to 150° C.

11 Claims, 4 Drawing Sheets

(51) Int. Cl.
  *C08K 3/38* (2006.01)
  *F21Y 115/10* (2016.01)
(52) U.S. Cl.
  CPC .............. *F21V 7/0066* (2013.01); *F21V 7/22* (2013.01); *F21V 19/001* (2013.01); *H01L 33/46* (2013.01); *C08K 2003/2227* (2013.01); *C08K 2003/2241* (2013.01); *C08K 2003/2296* (2013.01); *C08K 2003/3045* (2013.01); *C08K 2003/382* (2013.01); *F21Y 2115/10* (2016.08); *H01L 33/60* (2013.01); *H01L 2224/48091* (2013.01); *H01L 2224/8592* (2013.01); *H01L 2924/181* (2013.01)

(56) References Cited

U.S. PATENT DOCUMENTS

| | | | |
|---|---|---|---|
| 2010/0273927 A1* | 10/2010 | Taguchi | C08L 83/04 524/433 |
| 2012/0319154 A1* | 12/2012 | Fujii | H01L 33/60 257/98 |
| 2013/0011617 A1* | 1/2013 | Tasaki | B29C 45/14 428/148 |
| 2013/0082369 A1* | 4/2013 | Kokubo | H01L 23/296 257/666 |
| 2013/0274398 A1* | 10/2013 | Shiobara | H01L 33/60 524/413 |
| 2015/0008455 A1* | 1/2015 | Tozawa | H01L 33/60 257/88 |
| 2016/0264779 A1* | 9/2016 | Tajima | C08L 83/06 |

FOREIGN PATENT DOCUMENTS

| | | |
|---|---|---|
| JP | 2010205954 A | 9/2010 |
| JP | 2011023621 A | 2/2011 |
| JP | 2011054902 A | 3/2011 |
| JP | 2012124358 A | 6/2012 |
| JP | 2012138536 A | 7/2012 |

* cited by examiner

LED DEVICE AND COATING LIQUID USED FOR PRODUCTION OF SAME

CROSS REFERENCE TO RELATED APPLICATION

This Application is a 371 of PCT/JP2014/000090 filed on Jan. 10, 2014 which, in turn, claimed the priority of Japanese Patent Application No. JP2013-002568 filed on Jan. 10, 2013, both applications are incorporated herein by reference.

TECHNICAL FIELD

The present invention relates to an LED device and a coating liquid used for production of the LED device.

BACKGROUND ART

In recent years, white LED devices have been widely used in which phosphors, such as YAG phosphor, are disposed near gallium nitride (GaN)-based blue light emitting diode (LED) chips. Such white LED devices provide white light by mixing blue light emitted from blue LED chips and yellow light emitted from phosphors that have received blue light. Other white LED devices have been also developed in which phosphors that emit green or red fluorescence are disposed near blue LED chips. Such white LED devices provide white light by mixing blue light emitted from blue LED chips and red and green light emitted from phosphors that have received blue light.

There are various applications of white LED devices, and these white LED devices have recently replaced fluorescent lamps and incandescent lamps. Such lighting devices contain a number of white LED devices. Therefore, it is important to increase the light extraction efficiency of each white LED device in order to achieve cost reduction and life extension of the lighting devices. It is also important to increase the light extraction efficiency not only of white LED devices but also of single-color LED devices with no phosphor.

Conventional LED devices have suffered from difficulty in increasing the light extraction efficiency because substrates having LED elements tend to absorb the light from the LED elements and the fluorescence from phosphors. LED devices have been thus developed in which reflectors with high light reflectance are disposed around LED elements. Such reflectors are generally formed from plated metal or the like.

However, reflectors formed from plated metal are conductive. Therefore, such reflectors cannot be formed all over the substrate, which has imposed a problem that the substrate in the area having no reflector formed thereon absorbs light. On the other hand, a reflector formed by covering plated metal with a resin layer (Patent Literature 1) and a reflector formed by covering plated metal with a white resin layer (Patent Literature 2) have been also proposed.

CITATION LIST

Patent Literatures

Patent Literature 1: JP 2005-136379 A
Patent Literature 2: JP 2011-23621 A

SUMMARY OF INVENTION

Technical Problem

However, in reflectors having the surface covered with resin, as described in Patent Literature 1, and in reflectors formed from resin, resins are susceptible to thermal- and photo-degradation. This has advantageously resulted in the fact that the light reflectivity of the reflective layer decreases over time, and current flows through the reflective layer, or the like. In particular, resins have been susceptible to degradation when the amount of light emitted from LED elements in LED devices for vehicle headlights or the like is increased.

Materials having organic compounds as a main backbone, such as epoxy resins, easily get colored at high temperature. Thus metal reflectors covered with thermosetting resins have a problem of easy reduction in reflectance due to the coloring of the resins, as disclosed in Patent Literature 2.

Silicone resin has relatively high thermal resistance. Silicone resin, however, has a relatively low glass transition point, and the coefficient of linear expansion drastically changes at a glass transition point. Thus metal reflectors covered with thermosetting resins have suffered from easy peeling of silicone resin from metal reflectors due to changes in temperature outside LED devices.

The present invention has been made in light of such circumstances. That is, an object of the present invention is to provide: an LED device having a reflective layer less susceptible to thermal degradation and capable of efficiently reflecting light for a long period of time; and a coating liquid that is used for the production of the reflective layer.

Solution to Problem

The present invention relates to the following aspects.

1. An LED device including: a substrate, an LED element disposed on the substrate, and a reflective layer disposed at least around the LED element on the substrate, wherein the reflective layer contains a white pigment and a polysiloxane, the rate of decrease in reflectance of light with a wavelength of 500 nm of the reflective layer after storage of the reflective layer at 180° C. for 1,000 hours is 10% or less of the reflectance before storage at 180° C., and the reflective layer has no glass transition point in a range of from −70° C. to 150° C.

2. The LED device according to the above 1, wherein the amount of bifunctional silicon in the polysiloxane is 40% by mass or less with respect to the total amount of silicon in the polysiloxane.

3. The LED device according to the above 1 or 2, wherein the reflective layer further contains metal oxide microparticles.

4. The LED device according to the above 3, wherein the metal oxide microparticles have a smaller average particle size than the white pigment.

5. The LED device according to any one of the above 1 to 4, wherein the reflective layer further contains inorganic particles.

6. The LED device according to any one of the above 1 to 5, wherein the reflective layer further contains a clay mineral.

7. The LED device according to the above 6, wherein the clay mineral contains at least one selected from the group consisting of laminar clay minerals, allophane, and imogolite.

8. The LED device according to any one of the above 1 to 7, wherein the reflective layer further contains a silane coupling agent.

9. The LED device according to any one of the above 1 to 8, wherein the white pigment is at least one selected from the group consisting of titanium oxide, aluminum oxide, barium sulfate, zinc oxide, and boron nitride.

10. The LED device according to any one of the above 1 to 9, wherein the amount of the white pigment in the reflective layer is 50% by mass or more and 95% by mass or less.

11. The LED device according to the above 1, wherein the reflective layer is disposed on the substrate other than the area where the LED element is disposed.

12. The LED device according to the above 1, wherein the reflective layer is formed between the substrate and the LED element.

13. A coating liquid used for producing a reflective layer of an LED device, wherein the coating liquid contains a white pigment and a polysiloxane precursor, the rate of decrease in reflectance of light with a wavelength of 500 nm of the reflective layer, which is a cured layer of the coating liquid, after storage of the reflective layer at 180° C. for 1,000 hours is 10% or less of the reflectance before storage at 180° C., and the reflective layer has no glass transition point in a range of from −70° C. to 150° C.

Advantageous Effects of Invention

According to the present invention, provided is an LED device from which light can be efficiently extracted for a long period of time because of less degradation of a reflective layer for reflecting light emitted from an LED element or the like; and a coating liquid that is used for the production of the LED device.

DESCRIPTION OF EMBODIMENTS

The present invention will be described below by way of embodiments, but the present invention is not limited to the following embodiments. The same or similar reference signs are applied to members having the same or similar function in the figures, and the description thereof is omitted. It is noted that the drawings are schematic. Therefore, specific dimensions or the like should be determined according to the following description.

1. LED Device

Figure 1:
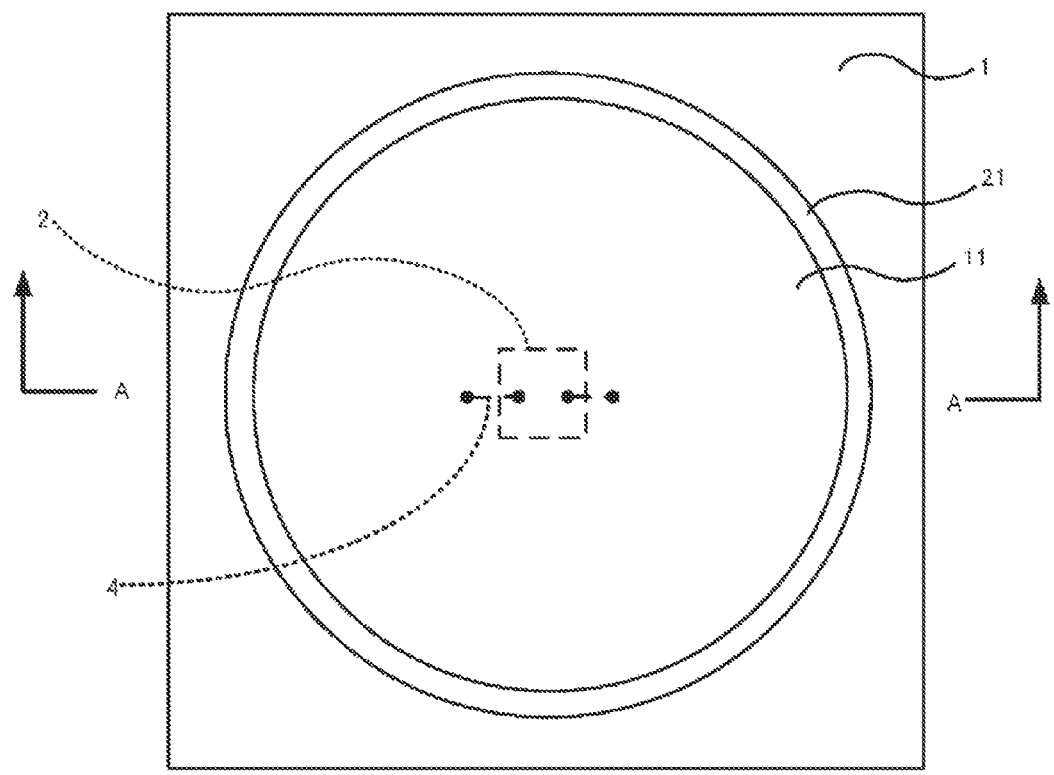
FIG. 1 is a top view of an exemplary LED device of the present invention.
Figure 2:
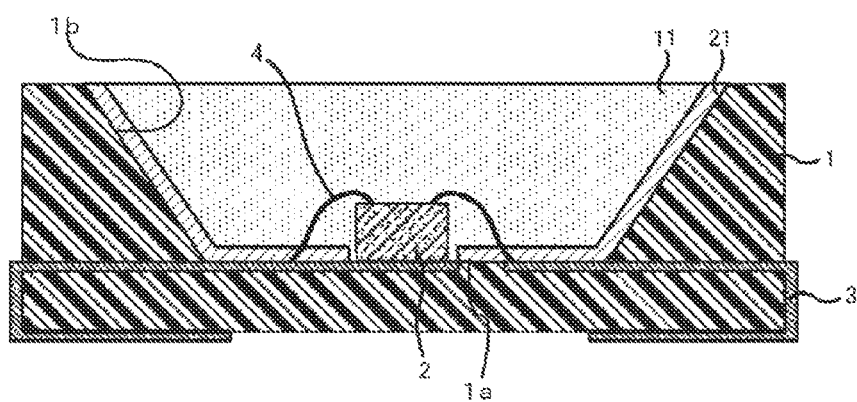
FIG. 2 is a cross-sectional view of an exemplary LED device of the present invention.

FIG. 1 is a top view of an exemplary LED device 100A of the present invention. FIG. 2 is a cross-sectional view of the exemplary LED device 100A of the present invention. An LED element 2 is wire bonding type as illustratively described herein.

As illustrated in FIG. 2, the LED device 100A has a substrate 1, the LED element 2 disposed on the substrate 1, a reflective layer 21 disposed at least around the LED element 2 on the substrate 1. As illustrated in FIG. 2, the LED device 100A may include a wavelength conversion layer 11 that covers the LED element 2 and the reflective layer 21.

As illustrated in FIG. 2, the LED element 2 may be disposed on a bottom 1a of a truncated cone-shaped cavity (recess) of the substrate 1. The LED element 2 here is electrically connected to a metal part (metal electrode part) 3 provided in the substrate 1 through an electrical wiring 4.

The reflective layer 21 is disposed on the substrate 1 other than the area where the LED element 2 is disposed. The reflective layer 21 continues from the bottom 1a to the side 1b of the truncated cone-shaped cavity (recess) of the substrate 1 to form a mortar shape. The reflective layer 21 is formed in the periphery of the wavelength conversion layer 11 to have a ring shape that is concentric with the wavelength conversion layer 11, as viewed from the top.

(1) Substrate

The substrate 1 is preferably insulated and resistant to heat, and preferably made of ceramic resins or heat resistant resins. Examples of heat resistant resins include liquid crystal polymers, polyphenylene sulfide, aromatic nylons, epoxy resins, hard silicone resins, and polyphthalamide.

The substrate 1 may contain an inorganic filler. The inorganic filler may be titanium oxide, zinc oxide, alumina, silica, barium titanate, calcium phosphate, calcium carbonate, white carbon, talc, magnesium carbonate, boron nitride, glass fiber, or the like.

(2) LED Element

The wavelength of light emitted from the LED element 2 is not limited to particular values. The LED element 2 may be, for example, an element that emits blue light (light of about 420 nm to 485 nm), and may be an element that emits ultraviolet light.

The LED element 2 is not limited to particular configurations. When the LED element 2 is a blue light-emitting element, the LED element 2 may have a laminate including a n-GaN based compound semiconductor layer (clad layer), a InGaN based compound semiconductor layer (light-emitting layer), a p-GaN based compound semiconductor layer (clad layer), and a transparent electrode layer. The LED element 2 may have a light-emitting surface of, for example, 200 to 300 μm×200 to 300 μm. The height of the LED element 2 is typically about 50 to 200 μm. In the LED device 100 illustrated in FIG. 1 and FIG. 2, only one LED element 2 is disposed on the substrate 1, but multiple LED elements 2 may be disposed on the substrate 1.

(3) Reflective Layer

The reflective layer 21 is a layer that reflects light emitted from the LED element 2 and light emitted from a phosphor contained in the wavelength conversion layer 11 toward the light extraction surface of the LED device 100A. The reflective layer 21 is formed at least in the area other than the area where the LED element 2 is disposed, on the surface of the substrate 1, and may be formed in the area other than the area where the LED element 2 is disposed. The "area where the LED element 2 is disposed" refers to the light-emitting surface of the LED element 2 and the connection part between the LED element 2 and the metal part (metal electrode part) 3. That is, the reflective layer 21 is formed in the area that does not inhibit emission of light from the LED element 2, and connection between the LED element 2 and the metal part (metal electrode part) 3. The reflective layer 21 is preferably formed at least in the area around the LED element 2, for example, as illustrated in FIG. 2.

When the substrate 1 has a cavity as illustrated in FIG. 2, the reflective layer 21 is also preferably formed on the side 1b of the cavity. When the reflective layer 21 is formed on the side 1b of the cavity, the light traveling in the direction horizontal to the surface of the wavelength conversion layer 11 can be extracted from the light extraction surface through the reflection on the reflective layer 21. That is, the amount of light extracted from the light extraction surface of the LED device 100 increases.

The thickness of the reflective layer 21 is preferably from 5 to 50 μm, more preferably from 5 to 30 μm. The thickness of the reflective layer 21 of 50 μm or less prevents cracks in the reflective layer 21. On the other hand, the thickness of the reflective layer 21 of 5 μm or more tends to sufficiently increase the light reflectivity of the reflective layer 21 to improve the light extraction efficiency.

The light reflectance of the reflective layer 21 in the LED device 100A of the present invention slightly decreases even after storage of the reflective layer 21 at 180° C. for 1,000 hours. Specifically, the rate of decrease in reflectance of light with a wavelength of 500 nm of the reflective layer 21 after storage at 180° C. for 1,000 hours is 10% or less of the reflectance before storage at 180° C. The rate of decrease in reflectance is preferably 5% or less, more preferably 2% or less.

The rate of decrease in reflectance is calculated from [(reflectance of reflective layer before storage at 180° C.−reflectance of reflective layer after storage at 180° C. for 1,000 hours)/(reflectance of reflective layer before storage at 180° C.)]×100. Each reflectance is measured with a spectrophotometer. The rate of decrease in reflectance may be calculated by (i) preparing a sample in which a film having the same composition and thickness as those of the reflective layer is formed on a transparent glass plate and (ii) storing the sample at 180° C. for 1,000 hours. The reflectance of the reflective layer in the LED device may be directly measured, and the rate of decrease may be calculated.

As mentioned above, reflective layers and the like that include a metal reflector covered with resin has been conventionally proposed. However, the temperature of the environment where high-intensity lighting devices or vehicle lighting devices operate ranges from about −40° C. to 120° C. For this, when LED devices are applied to such lighting devices, the heat in the operating environment and the light or heat from LED elements may easily cause degradation of the resin in the reflective layer to decrease the light extraction properties from the LED devices.

On the other hand, the reflectance of the reflective layer 21 in the LED device 100A of the present invention does not significantly decreases even after storage at 180° C. for a long period of time as mentioned above. Therefore, good light extraction properties from the LED device 100A are maintained for a long period of time. The reflectance of the reflective layer 21 is controlled by the type of polysiloxane contained in the reflective layer 21 or the like. The temperature of 180° C. is the maximum heat-resistance temperature of ordinal LED elements.

In addition, the reflective layer 21 of the LED device 100A of the present invention has no glass transition point in the range of from −70° C. to 150° C. The heat and cold in the environment where the LED device operates thus hardly change the physical properties of the reflective layer 21, which tends to provide closer contact between the substrate 1 and the reflective layer 21. The glass transition point of the reflective layer 21 may be less than −70° C., or more than 150° C., and the glass transition point is preferably more than 150° C., more preferably 160° C. or more.

The glass transition point of the reflective layer 21 is controlled by the composition of the polysiloxane in the reflective layer 21.

The glass transition point of the reflective layer 21 is measured by the TMA method (thermomechanical analysis method) in accordance with JIS K7197. Specifically, the glass transition point is measured with a thermomechanical analyzer by heating from −100° C. at a rate of 10° C./min. The glass transition point may be the value obtained by preparing a sample in which a film having the same composition and thickness as those of the reflective layer is formed on a transparent glass plate and measuring the glass transition point of the sample. The glass transition point of the reflective layer in the LED device may be directly measured.

The reflective layer 21 of the LED device 100A of the present invention is a layer containing a white pigment bonded with a polysiloxane and is non-conductive. This allows the reflective layer 21 to be formed in any area of the substrate 1 in the LED device 100A of the present invention and to be also formed in the gap between the metal parts 3 or the like. That is, the light extraction efficiency from the LED device 100A can be improved by increasing the area of the reflective layer 21 formed.

The reflective layer 21 of the present invention here contains a white pigment and a polysiloxane but may optionally contain metal oxide microparticles, inorganic particles, clay minerals, and silane coupling agents. Hereinafter, each ingredient contained in the reflective layer 21 will be described.

(3-1) White Pigment

The white pigment contained in the reflective layer 21 can be any white pigment particles with high reflectivity.

Examples of white pigments include calcium carbonate, magnesium carbonate, barium carbonate, magnesium sulfate, barium sulfate, calcium sulfate, zinc oxide, magnesium oxide, calcium oxide, titanium oxide, aluminum oxide, zirconium oxide, zinc sulfide, aluminium hydroxide, boron nitride, aluminium nitride, potassium titanate, barium titanate, aluminum titanate, strontium titanate, calcium titanate, magnesium titanate, and hydroxyapatite. Such white pigments may be contained singly or in combination in the reflective layer 21. The white pigment is preferably titanium oxide, aluminum oxide, barium sulfate, zinc oxide, boron nitride, or combination thereof.

When the white pigment contains boron nitride, the thermal conductivity of the reflective layer 21 tends to increase. This allows the heat generated from the LED element to be readily released from the reflective layer 21 to the outside of the LED device 100A. The temperature of the LED device 100A is thus kept low to extend the life of the LED device.

The average primary particle size of the white pigment is preferably more than 100 nm and 20 μm or less, more preferably more than 100 nm and 10 μm or less, still more preferably from 200 nm to 2.5 μm. The "average primary particle size" refers to the D50 value measured with a laser diffraction-type particle size distribution analyzer. Examples of laser diffraction-type particle size distribution measuring devices include a laser diffraction-type particle size distribution measuring device available from Shimadzu Corporation.

The amount of the white pigment in the reflective layer 21 is preferably from 50% to 95% by mass, more preferably from 70% to 90% by mass with respect to the total mass of the reflective layer. The amount of the white pigment of 50% by mass or more tends to achieve sufficient light reflectivity of the reflective layer 21 to increase the light extraction efficiency well. On the other hand, the amount of the white pigment of more than 95% by mass results in a relatively reduced amount of the binder (polysiloxane), which may decrease the strength of the reflective layer 21 or may separate the white pigment from the surface.

(3-2) Polysiloxane

The polysiloxane contained in the reflective layer 21 may be a polymer (cured polymer) of a monomer of a bifunctional silane compound, trifunctional silane compound, or tetrafunctional silane compound, or oligomers of such compounds.

The amount of the polysiloxane in the reflective layer 21 is preferably from 5% to 50% by mass, more preferably 10% to 40% by mass with respect to the total mass of the reflective layer. The amount of the polysiloxane of less than 5% by mass prevents the white pigment from being bound well to the reflective layer, which facilitates generation of pigment powder on the surface. The amount of the polysiloxane of more than 40% by mass may cause cracks in the reflective layer 21 due to cure shrinkage.

With regard to the polysiloxane, the amount of bifunctional silicon in the polysiloxane is preferably 40% by mass or less, more preferably 25% by mass or less, and still more preferably 15% by mass or less with respect to the total amount of silicon in the polysiloxane. The "bifunctional silicon" refers to silicon derived from bifunctional silane compounds. The polysiloxane with 40% by mass or less of bifunctional silicon tends to increase the glass transition point of the reflective layer 21 to 150° C. or more. The polysiloxane with more than 40% by mass of bifunctional silicon results in an increased amount of organic groups in the polysiloxane. This makes difficult the binding between the hydroxyl groups on the surface of the substrate 1 and silicon in the polysiloxane, which easily provides looser contact between the substrate 1 and the reflective layer 21.

On the other hand, the amount of tetrafunctional silicon (silicon derived from tetrafunctional silane compounds) in the polysiloxane is preferably from 0 to 300 parts by mass, more preferably from 0 to 200 parts by mass, still more preferably from 0 to 100 parts by mass with respect to 100 parts by mass of the amount of trifunctional silicon (silicon derived from trifunctional silane compounds). The tetrafunctional silane compound in the polysiloxane promotes the binding between silicon in the polysiloxane and the hydroxyl groups on the surface of the substrate 1 to easily achieve close contact between the substrate 1 and the reflective layer 21. It is noted that an excessive amount of the tetrafunctional silane compound increases the degree of crosslinking of the polysiloxane, which may cause cracks in the reflective layer 21.

The mass ratio of the bifunctional silicon, trifunctional silicon, and tetrafunctional silicon in the reflective layer 21 is obtained by solid Si-nuclear magnetic resonance (hereinafter referred to as NMR). A solid Si-NMR spectrum will be described.

For example, polysiloxane mainly composed of tetrafunctional silicon is represented by the rational formula of $SiO_2 \cdot nH_2O$ and has a net structure in which oxygen atoms O are bound to the corners of a tetrahedron with a silicon atom Si and such oxygen atoms O are further bound to silicon atoms Si.

Schematic diagram (A) below indicates the Si—O net structure without the above tetrahedral structure. Schematic diagram (B) indicates the repeating unit of Si—O—Si—O— in Schematic diagram (A) where a part of the Si—O linkages is substituted by another member (for example, —H, —CH$_3$, and the like). In terms of one tetrafunctional silicon atom Si, there are a silicon atom Si ($Q^4$) having four —OSi groups as illustrated in Schematic diagram (A), a silicon atom Si ($Q^3$) having three —OSi groups as illustrated in Schematic diagram (B), and the like. In a Si-NMR spectrum, peaks based on the above respective silicon atoms Si are sequentially called $Q^4$ peak, $Q^3$ peak, . . . etc.

[Chemical Formula 1]

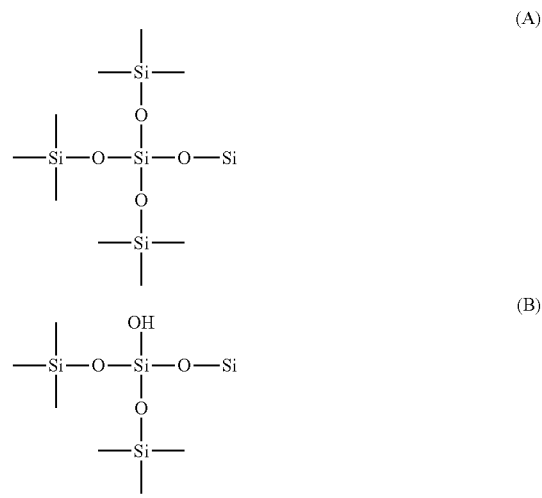

Such tetrafunctional silicon atoms (i.e., silicon derived from tetrafunctional silane compounds) are generally called Q sites. In this specification, $Q^0$ to $Q^4$ peaks derived from the Q sites are referred to as a $Q''$ peak group. The $Q''$ peak group of a silica film free of organic substituents is typically observed as a continuous multipeak spectrum in the chemical shift ranging from −80 to −130 ppm.

On the other hand, trifunctional silicon (i.e., silicon derived from trifunctional silane compounds) bound to three oxygen atoms and another atom (typically carbon) are generally called T sites. The peaks derived from the T sites are observed as $T^0$ to $T^3$ peaks in a similar manner to the Q sites. In this specification, the peaks derived from the T sites are referred as a $T''$ peak group. The $T''$ peak group is typically observed as a continuous multipeak spectrum in the range of a higher magnetic field (typically chemical shift from −80 to −40 ppm) than the $Q''$ peak group.

Furthermore, bifunctional silicon (i.e., silicon derived from bifunctional silane compounds) bound to two oxygen atoms and two other atoms (typically carbons) are generally called D sites. The peaks derived from the D sites are also observed as $D^0$ to $D''$ peaks ($D''$ peak group) in a similar manner to the peak groups derived from the Q sites or T sites. The $D''$ peak group is observed as a multipeak spectrum in a higher magnetic field (typically chemical shift ranging from −3 to −40 ppm) than the $Q''$ and $T''$ peak groups.

Similarly, monofunctional silicon (i.e., silicon derived from monofunctional silane compounds) bound to one oxygen atom and three other atoms (typically carbon atoms) are generally called M sites. The peaks derived from the M sites are observed as a multipeak spectrum in the range of a higher magnetic field (typically chemical shift from 0 to −3 ppm) than the $D''$ peak group.

Figure 7:
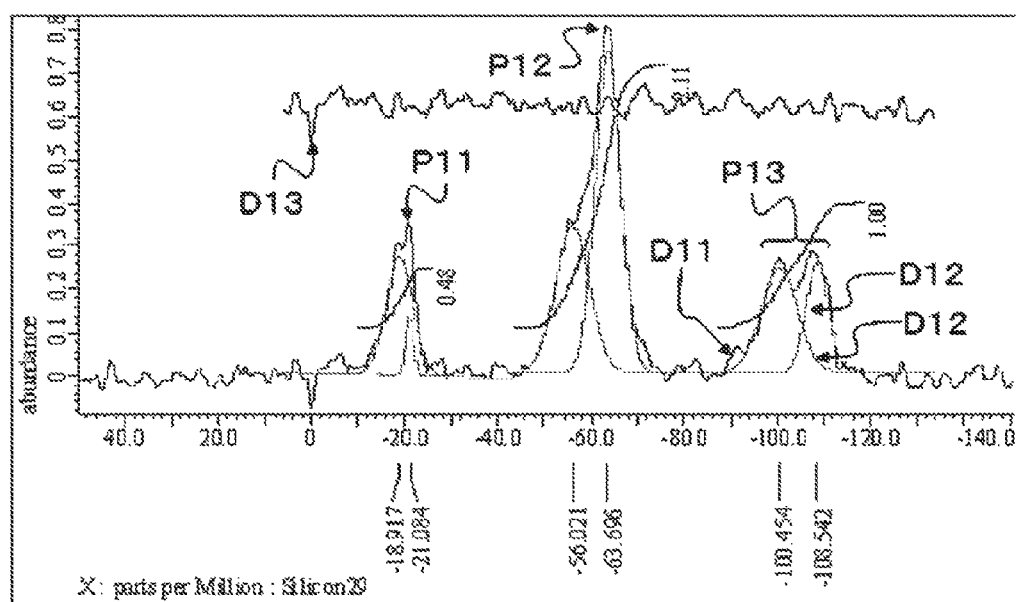
FIG. 7 is a figure illustrating an exemplary solid Si-NMR spectrum.

Reference is made to FIG. 7. FIG. 7 shows an exemplary Si-NMR spectrum of the polysiloxane. In FIG. 7, the abscissa represents a chemical shift, and the ordinate represents the "relative intensity" depending on the abundance of the compound having each structure.

In FIG. 7, D11 indicates the measured data. D12 indicates the data modeled with the Gaussian function. D13 indicates the differential spectrum.

In the example illustrated in FIG. 7, peak P11 (chemical shift at and near −20.0 ppm) is a D″ peak group, peak P12 (chemical shift at and near −60.0 ppm) is a T″ peak group, and peak P13 (chemical shift from about −100.0 to −110 ppm) is a Q″ peak group. That is, the polysiloxane contains bifunctional silicon, trifunctional silicon, and tetrafunctional silicon.

The area ratio of the D″, T″, and Q″ peak groups corresponds with the mass ratio (molar ratio) of silicon atoms in the environments corresponding to the respective peak groups. Given that the total area of all peaks is the total mass (molar amount) of silicon in the polysiloxane, comparison of the areas of the Q″ peak group, the T″ peak group, the D″ peak group, and the M″ peak group provides the levels of bifunctional silicon, trifunctional silicon, and tetrafunctional silicon in the polysiloxane.

(Bifunctional Silane Compound)

Examples of bifunctional silane compounds for providing the polysiloxane include the compounds represented by the following general formula (II).

$$R^4{}_2Si(OR^5)_2 \quad (II)$$

In the general formula (II), $R^5$ each independently represents an alkyl group or a phenyl group, preferably a C1 to C5 alkyl group or a phenyl group. $R^4$ represents a hydrogen atom or an alkyl group.

Specific examples of bifunctional silane compounds include dimethoxysilane, diethoxysilane, dipropoxysilane, dipentyloxysilane, diphenyloxysilane, methoxyethoxysilane, methoxypropoxysilane, methoxypentyloxysilane, methoxyphenyloxysilane, ethoxypropoxysilane, ethoxypentyloxysilane, ethoxyphenyloxysilane, methyldimethoxysilane, methylmethoxyethoxysilane, methyldiethoxysilane, methylmethoxypropoxysilane, methylmethoxypentyloxysilane, methylmethoxyphenyloxysilane, ethyldipropoxysilane, ethylmethoxypropoxysilane, ethyldipentyloxysilane, ethyldiphenyloxysilane, propyldimethoxysilane, propylmethoxyethoxysilane, propylethoxypropoxysilane, propyldiethoxysilane, propyldipentyloxysilane, propyldiphenyloxysilane, butyldimethoxysilane, butylmethoxyethoxysilane, butyldiethoxysilane, butylethoxypropoxysilane, butyldipropoxysilane, butylmethyldipentyloxysilane, butylmethyldiphenyloxysilane, dimethyldimethoxysilane, dimethylmethoxyethoxysilane, dimethyldiethoxysilane, dimethyldipentyloxysilane, dimethyldiphenyloxysilane, dimethylethoxypropoxysilane, dimethyldipropoxysilane, diethyldimethoxysilane, diethylmethoxypropoxysilane, diethyldiethoxysilane, diethylethoxypropoxysilane, dipropyldimethoxysilane, dipropyldiethoxysilane, dipropyldipentyloxysilane, dipropyldiphenyloxysilane, dibutyldimethoxysilane, dibutyldiethoxysilane, dibutyldipropoxysilane, dibutylmethoxypentyloxysilane, dibutylmethoxyphenyloxysilane, methylethyldimethoxysilane, methylethyldiethoxysilane, methylethyldipropoxysilane, methylethyldipentyloxysilane, methylethyldiphenyloxysilane, methylpropyldimethoxysilane, methylpropyldiethoxysilane, methylbutyldimethoxysilane, methylbutyldiethoxysilane, methylbutyldipropoxysilane, methylethylethoxypropoxysilane, ethylpropyldimethoxysilane, ethylpropylmethoxyethoxysilane, dipropylmethoxysilane, dipropylmethoxyethoxysilane, propylbutyldimethoxysilane, propylbutyldiethoxysilane, dibutylmethoxyethoxysilane, dibutylmethoxypropoxysilane, and dibutylethoxypropoxysilane. Of these, dimethoxysilane, diethoxysilane, methyldimethoxysilane, and methyldiethoxysilane are preferred.

(Trifunctional Silane Compound)

Examples of trifunctional silane compounds for providing the polysiloxane include the compounds represented by the following general formula (III).

$$R^1Si(OR^2)_3 \quad (III)$$

In the general formula (III), $R^2$ each independently represents an alkyl group or a phenyl group, preferably a C1 to C5 alkyl group or a phenyl group. $R^1$ represents a hydrogen atom or an alkyl group.

Specific examples of trifunctional silane compounds include monohydrosilane compounds, such as trimethoxysilane, triethoxysilane, tripropoxysilane, tripentyloxysilane, triphenyloxysilane, dimethoxymonoethoxysilane, diethoxymonomethoxysilane, dipropoxymonomethoxysilane, dipropoxymonoethoxysilane, dipentyloxymonomethoxysilane, dipentyloxymonoethoxysilane, dipentyloxymonopropoxysilane, diphenyloxylmonomethoxysilane, diphenyloxymonoethoxysilane, diphenyloxymonopropoxysilane, methoxyethoxypropoxysilane, monopropoxydimethoxysilane, monopropoxydiethoxysilane, monobutoxydimethoxysilane, monopentyloxydiethoxysilane, monophenyloxydiethoxysilane; monomethylsilane compounds, such as methyltrimetoxysilane, methyltriethoxysilane, methyltripropoxysilane, methyltripentyloxysilane, methylmonomethoxydiethoxysilane, methylmonomethoxydipropoxysilane, methylmonomethoxydipentyloxysilane, methylmonomethoxydiphenyloxysilane, methylmethoxyethoxypropoxysilane, and methylmonomethoxymonoethoxymonobutoxysilane; monoethylsilane compounds, such as ethyltrimethoxysilane, ethyltripropoxysilane, ethyltripentyloxysilane, ethyltriphenyloxysilane, ethylmonomethoxydiethoxysilane, ethylmonomethoxydipropoxysilane, ethylmonomethoxydipentyloxysilane, ethylmonomethoxydiphenyloxysilane, and ethylmonomethoxymonoethoxymonobutoxysilane; monopropylsilane compounds, such as propyltrimethoxysilane, propyltriethoxysilane, propyltripentyloxysilane, propyltriphenyloxysilane, propylmonomethoxydiethoxysilane, propylmonomethoxydipropoxysilane, propylmonomethoxydipentyloxysilane, propylmonomethoxydiphenyloxysilane, propylmethoxyethoxypropoxysilane, and propylmonomethoxymonoethoxymonobutoxysilane; monobutylsilane compounds, such as butyltrimethoxysilane, butyltriethoxysilane, butyltripropoxysilane, butyltripentyloxysilane, butyltriphenyloxysilane, butylmonomethoxydiethoxysilane, butylmonomethoxydipropoxysilane, butylmonomethoxydipentyloxysilane, butylmonomethoxydiphenyloxysilane, butylmethoxyethoxypropoxysilane, and butylmonomethoxymonoethoxymonobutoxysilane.

The surface of the reflective layer 21 is less hydrophobic when $R^1$ represented by general formula (III) in these trifunctional silane compounds is a methyl group. This easily causes the wetting and spreading of the composition for forming the wavelength conversion layer in the formation of the wavelength conversion layer 11 on the reflective layer 21, which provides close contact between the wavelength conversion layer 11 and the reflective layer 21. Examples of trifunctional silane compounds where $R^1$ represented by general formula (III) is a methyl group include methyltrimetoxysilane and methyltriethoxysilane, with methyltrimetoxysilane being particularly preferred.

(Tetrafunctional Silane Compound)

Examples of tetrafunctional silane compounds for providing the polysiloxane include the compounds represented by the following general formula (IV).

$$Si(OR^3)_4 \quad (IV)$$

In the above general formula, $R^3$ each independently represents an alkyl group or a phenyl group, preferably a C1 to C5 alkyl group or a phenyl group.

Specific examples of tetrafunctional silane compounds include alkoxy silanes, such as tetramethoxysilane, tetraethoxysilane, tetrapropoxysilanetetrabutoxysilane, tetrapentyloxysilane, tetraphenyloxysilane, trimethoxymonoethoxysilane, dimethoxydiethoxysilane, triethoxymonomethoxysilane, trimethoxymonopropoxysilane, monomethoxytributhoxysilane, monomethoxytripentyloxysilane, monomethoxytriphenyloxysilane, dimethoxydipropoxysilane, tripropoxymonomethoxysilane, trimethoxymonobutoxysilane, dimethoxydibutoxysilane, triethoxymonopropoxysilane, diethoxydipropoxysilane, tributhoxymonopropoxysilane, dimethoxymonoethoxymonobutoxysilane, diethoxymonomethoxymonobutoxysilane, diethoxymonopropoxymonobutoxysilane, dipropoxymonomethoxymonoethoxysilane, dipropoxymonomethoxymonobutoxysilane, dipropoxymonoethoxymonobutoxysilane, dibutoxymonomethoxymonoethoxysilane, dibutoxymonoethoxymonopropoxysilane, and monomethoxymonoethoxymonopropoxymonobutoxysilane; and aryloxysilanes. Of these, tetramethoxysilane and tetraethoxysilane are preferred.

(Oligomer of Silane Compound)

Polysiloxanes may be polymers of oligomers of silane compounds. The oligomers of silane compounds for providing polysiloxanes are obtained by mixing the above bifunctional silane compound, trifunctional silane compound, and tetrafunctional silane compound at a desired ratio, and reacting these compounds in the presence of an acid catalyst, water, and a solvent. The molecular weight of the oligomer is controlled by the reaction time, temperature, water concentration, and the like.

The weight average molecular weight of the oligomer measured with gel permeation chromatography (GPC) is preferably from 500 to 20,000, more preferably from 1,000 to 10,000, still more preferably from 1,500 to 6,000.

Examples of solvents for oligomer preparation include monohydric alcohols, such as methanol, ethanol, propanol, and n-butanol; alkyl carboxylates, such as methyl-3-methoxy propionate and ethyl-3-ethoxy propionate; polyhydric alcohols, such as ethylene glycol, diethylene glycol, propylene glycol, glycerol, trimethylolpropane, and hexanetriol; monoethers of polyhydric alcohols, such as ethylene glycol monomethyl ether, ethylene glycol monoethyl ether, ethylene glycol monopropyl ether, ethylene glycol monobutyl ether, diethylene glycol monomethyl ether, diethylene glycol monoethyl ether, diethylene glycol monopropyl ether, diethylene glycol monobutyl ether, propylene glycol monomethyl ether, propylene glycol monoethyl ether, propylene glycol monopropyl ether, propylene glycol monobutyl ether, and monoacetates thereof; esters, such as methyl acetate, ethyl acetate, and butyl acetate; ketones, such as acetone, methyl ethyl ketone, and methyl isoamyl ketone; polyhydric alcohol ethers obtained by alkyl-etherizing all hydroxyl groups in polyhydric alcohols, such as ethylene glycol dimethyl ether, ethylene glycol diethyl ether, ethylene glycol dipropyl ether, ethylene glycol dibutyl ether, propylene glycol dimethyl ether, propylene glycol diethyl ether, diethylene glycol dimethyl ether, diethylene glycol diethyl ether, and diethylene glycol methyl ethyl ether. These may be used singly or may be used in combination.

(3-3) Metal Oxide Microparticles

The reflective layer 21 may contain metal oxide microparticles having a smaller average particle size than the white pigment, for example, metal oxide microparticles having an average particle size of 5 nm or more and less than 100 nm. When the reflective layer 21 contains metal oxide microparticles, the reflective layer 21 has reduced coefficient of linear expansion. This maintains good contact between the reflective layer 21 and the substrate 1 even after the reflective layer 21 undergoes a heat history of significantly varying temperatures. When the reflective layer 21 contains metal oxide microparticles, the surface of the reflective layer 21 becomes uneven, which exerts an anchor effect between the reflective layer 21 and the wavelength conversion layer 11 formed on the reflective layer 21. This anchor effect provides very close contact between the reflective layer and the wavelength conversion layer. Moreover, the metal oxide microparticles relax the stress generated during the formation of the reflective layer 21 (for example, stress generated by polycondensation and drying of the polysiloxane). Such relaxation of the stress prevents cracks in the reflective layer 21 during the formation of the reflective layer 21.

The metal oxide microparticles are not limited to particular types, but preferably at least one type of metal oxide microparticles selected from the group consisting of aluminum oxide, zirconium oxide, zinc oxide, tin oxide, yttrium oxide, cerium oxide, titanium oxide, copper oxide, and bismuth oxide in terms of relatively easy availability.

The average primary particle size of the metal oxide microparticles is more preferably from 5 to 80 nm, still more preferably from 5 to 50 nm in view of the above respective effects. The average primary particle size in this range generates fine unevenness on the surface of the reflective layer 21 to provide the anchor effect described above. The average primary particle size of the metal oxide microparticles is measured, for example, by the Coulter counter method.

The metal oxide microparticles may be porous, where the specific surface area is preferably 200 $m^2/g$ or more. When the metal oxide microparticles are porous, impurities are absorbed to pores.

The amount of the metal oxide microparticles in the reflective layer 21 is preferably from 0.1 to 20% by mass, more preferably from 5 to 10% by mass with respect to the total mass of the reflective layer. An insufficient amount of the metal oxide microparticles results in a low anchor effect. In contrast, an excessive amount of the metal oxide microparticles results in a relatively reduced amount of the polysiloxane, which may provide an insufficient strength of the reflective layer 21.

(3-4) Inorganic Particles

The reflective layer 21 may contain inorganic particles having an average particle size of 100 nm or more and 100 μm or less. When the reflective layer 21 contains inorganic particles, the reflective layer 21 has reduced coefficient of linear expansion. This maintains good contact between the reflective layer 21 and the substrate 1 even after the reflective layer 21 undergoes a heat history of significantly varying temperatures. The inorganic particles also occupy the gaps between the white pigment and other particles to easily increase the strength of the reflective layer 21. Furthermore, when the coating liquid for forming the reflective layer 21 contains inorganic particles, the coating liquid tends to have increased viscosity and thus have increased coating properties.

The average particle size of the inorganic particles is preferably from 100 nm or more and 50 μm or less, more preferably 1 μm or more and 30 μm or less in order for the inorganic particles to occupy the gaps generated in the interface between the white pigment particles and other particles. The average particle size of the inorganic particles can be measured, for example, by the Coulter counter method.

Examples of inorganic particles include oxide particles, such as silicon oxide, aluminum oxide, and zirconium oxide, fluoride particles, such as magnesium fluoride, and combinations thereof. The inorganic particles are preferably oxide particles and in particular, the inorganic particles are preferably silicon oxide in terms of the stability of the reflective layer 21 to the binder (polysiloxane).

The amount of the inorganic particles in the reflective layer 21 is preferably from 0 to 20% by mass, more preferably from 5 to 10% by mass with respect to the total mass of the reflective layer. The presence of the inorganic particles tends to provide close contact between the reflective layer 21 and the substrate 1.

(3-5) Clay Mineral

The reflective layer 21 may contain a clay mineral. When the reflective layer 21 contains a clay mineral, the reflective layer 21 has reduced coefficient of linear expansion. This maintains good contact between the reflective layer 21 and the substrate 1 even after the reflective layer 21 undergoes a heat history of significantly varying temperatures.

Examples of clay minerals include laminar silicate minerals, imogolite, and allophane. Laminar silicate minerals are preferably swelling clay minerals having a mica structure, kaolinite structure, or smectite structure, more preferably swelling clay minerals having a smectite structure with good swelling properties.

Examples of laminar silicate minerals include natural and synthetic smectite clay minerals, such as hectorite, saponite, stevensite, beidellite, montmorillonite, nontronite, and bentonite; swelling mica clay minerals, such as Na-type tetrasilicic fluorine mica, Li-type tetrasilicic fluorine mica, Na-type fluorine taeniolite, Li-type fluorine taeniolite; and vermiculite; and kaolinite, and mixtures thereof.

Example of commercially available clay minerals include Laponite XLG (synthetic hectorite analogue available from Laporte plc, UK), Laponite RD (synthetic hectorite analogue available from Laporte plc, UK), Thermabis(synthetic hectorite analogue available from Henkel AG & Co. KGaA, Germany), Smecton SA-1 (saponite analogue available from Kunimine Industries Co., Ltd.), BEN-GEL (natural bentonite available from HOJUN Co., Ltd.), Kunipia F (natural montmorillonite available from Kunimine Industries Co., Ltd.), Veegum (natural hectorite available from Vanderbilt Chemicals, LLC, US), Dimonite (synthetic swelling mica available from Topy Industries, Ltd.), Micro Mica (synthetic swelling mica available from Co-op Chemical Co., Ltd.), Somasif (synthetic swelling mica available from Co-op Chemical Co., Ltd.), SWN (synthetic smectite available from Co-op Chemical Co., Ltd.), and SWF (synthetic smectite available from Co-op Chemical Co., Ltd.). The surfaces of these clay mineral particles may be modified (treated) with an ammonium salt or the like.

The amount of the clay mineral in the reflective layer 21 is preferably from 0 to 20% by mass, more preferably from 5 to 10% by mass with respect to the total mass of the reflective layer. The presence of the clay mineral tends to provide close contact between the reflective layer 21 and the substrate 1.

(3-6) Silane Coupling Agent

The reflective layer 21 may contain a silane coupling agent. When the reflective layer 21 contains a silane coupling agent, the close contact is provided between the substrate 1 and the reflective layer 21 to increase the durability of the LED device 100A.

Examples of the silane coupling agent include vinyltrimetoxysilane, vinyltriethoxysilane, 2-(3,4-epoxycyclohexyl)ethyltrimethoxysilane, 3-glycidoxypropyltrimetoxysilane, 3-glycidoxypropylmethyldiethoxysilane, 3-glycidoxypropyltriethoxysilane, p-styryl trimethoxysilane, 3-methacryloxypropylmethyldimethoxysilane, 3-methacryloxypropyltrimethoxysilane, 3-methacryloxypropyltriethoxysilane, 3-acryloxypropyltrimethoxysilane, N-2-(aminoethyl)-3-aminopropylmethyldimethoxysilane, N-2-(aminoethyl)-3-aminopropyltrimethoxysilane, N-2-(aminoethyl)-3-aminopropyltriethoxysilane, 3-aminopropyltrimethoxysilane, 3-triethoxysilyl-N-(1,3-dimethyl-butylidene)propylamine, N-phenyl-3-aminopropyltriethoxysilane, N-(vinylbenzyl)-2-aminoethyl-3-aminopropyltrimethoxysilane hydrochloride, 3-ureidopropyltrimethoxysilane, 3-chloropropyltrimetoxysilane, 3-mercaptopropylmethyldimethoxysilane, 3-mercaptopropyltrimethoxysilane, bis(triethoxysilylpropyl)tetrasulfide, and 3-isocyanatepropyltriethoxysilane. These silane coupling agents may be contained singly or in combination in the reflective layer 21.

The amount of the silane coupling agent in the reflective layer is preferably from 1% to 10% by mass, more preferably 3% to 7% by mass with respect to the total mass of the reflective layer 21. An insufficient amount of the silane coupling agent makes it difficult to provide close contact between the reflective layer 21 and the substrate 1. In contrast, an excessive amount of the silane coupling agent may reduce the thermal resistance of the reflective layer 21.

(3-7) Metal Alkoxide or Metal Chelate

The reflective layer 21 may contain cured products (reaction products) of metal alkoxides or metal chelates containing metal elements other than a Si element. The metals in metal alkoxides or metal chelates form methaloxane bonds with the polysiloxane and the hydroxyl groups on the surface of the substrate 1 and the wavelength conversion layer 11 in the formation of the reflective layer. Since the methaloxane bond is very strong, the presence of these cured products (reaction products) in the reflective layer 21 results in close contact of the reflective layer 21 with the substrate 1 and the wavelength conversion layer 11.

Some of the metal alkoxides or metal chelates form nano-sized clusters with methaloxane bonds in the reflective layer 21. The photocatalyst effect of such clusters oxidizes hydrogen sulfide gas present around the LED device 100A and causing rapid metal corrosion or the like to yield sulfur dioxide gas causing less metal corrosion.

The metal elements in metal alkoxides or metal chelates are preferably the metal elements in Group 4 or Group 13 except for Si, preferably the compounds represented by the following general formula (V).

$$M^{m+}X_nY_{m-n} \tag{V}$$

In general formula (V), M represents the metal elements in Group 4 or Group 13 (except for Si), and m represents the valence (3 or 4) of M. X represents a hydrolytic group and n represents the number of group X (an integer of from 2 to 4). It is noted that m≥n. Y represents a univalent organic group.

In general formula (V), the metal elements in Group 4 or Group 13 represented by M are preferably aluminium, zirconium, and titanium, particularly preferably zirconium. The cured products of zirconium alkoxides or chelates have no absorption wavelength in the light emitting wavelength region of ordinal LED elements (particularly blue light (wavelength of 420 to 485 nm)). That is, the cured products are unlikely to absorb light from the LED element 2.

In general formula (V), the hydrolytic group represented by X may be a group that is hydrolyzed by water to produce a hydroxyl group. Preferred examples of hydrolytic groups include C1 to C5 lower alkoxy groups, an acetoxy group, a butanoxime group, and a chloro group. In general formula (V), all of the groups represented by X may be the same or may be different.

The hydrolytic group represented by X is hydrolyzed and released during the formation of the reflective layer. Thus the compound produced after the hydrolysis of the group represented by X is preferably neutral and has a low boiling point. Therefore, the group represented by X is preferably a C1 to C5 lower alkoxy group, more preferably a methoxy group or an ethoxy group.

In general formula (V), the univalent organic group represented by Y may be a univalent organic group present in ordinal silane coupling agents. Specifically, the univalent organic group represented by Y may an aliphatic group, alicyclic group, aromatic group, alicyclic aromatic group that have 1 to 1000 carbon atoms, preferably 500 or less carbon atoms, more preferably 100 or less carbon atoms, still more preferably 40 or less carbon atoms, yet still more preferably 6 or less carbon atoms. The organic group represented by Y may be a group formed by binding an aliphatic group, alicyclic group, aromatic group, and alicyclic aromatic group through a connecting group. The connecting group may an atom, such as O, N, and S, or an atomic group containing such an atom.

The organic group represented by Y may have a substituent. Example of substituents include halogen atoms, such as F, Cl, Br, and I; organic groups, such as a vinyl group, methacryloxy group, acryloxy group, styryl group, mercapto group, epoxy group, epoxycyclohexyl group, glycidoxy group, amino group, cyano group, nitro group, sulfonate group, carboxy group, hydroxy group, acyl group, alkoxy group, imino group, and phenyl group.

Specific examples of metal alkoxides or metal chelates of aluminium represented by general formula (V) include aluminium triisopropoxide, aluminum tri-n-butoxide, aluminum tri-t-butoxide, and aluminum triethoxide.

Specific examples of metal alkoxides or metal chelates of zirconium represented by general formula (V) include zirconium tetramethoxide, zirconium tetraethoxide, zirconium tetra-n-propoxide, zirconium tetra-i-propoxide, zirconium tetra-n-butoxide, zirconium tetra-i-butoxide, zirconium tetra-t-butoxide, zirconium dimethacrylate dibutoxide, and dibutoxyzirconium bis(ethyl acetoacetate).

Specific examples of metal alkoxides or metal chelates of titanium element represented by general formula (V) include titanium tetraisopropoxide, titanium tetra-n-butoxide, titanium tetra-i-butoxide, titanium methacrylate triisopropoxide, titanium tetramethoxypropoxide, titanium tetra-n-propoxide, titaniumtetraethoxide, titanium lactate, titanium bis(ethylhexoxy)bis(2-ethyl-3-hydroxyhexoxide), and titanium acetylacetonate.

The metal alkoxides or metal chelates illustrated above are some of commercially available organic metal alkoxides or metal chelates that are easily obtained. The metal alkoxides or metal chelates described in the list of coupling agents and related products in Chapter 9 of "Optimum Application Technique for Coupling Agents" published by the National Institute of Science and Technology Policy can be also used in the present invention.

The amount of the cured product (reaction product) of the metal alkoxides or metal chelates contained is preferably from 1 to 10% by mass, more preferably from 2 to 7% by mass with respect to the total mass of the reflective layer. An insufficient amount of the cured product (reaction product) hardly exerts the effect of making the contact closer or the like.

(4) Wavelength Conversion Layer

The LED device 100 may include the wavelength conversion layer 11. The wavelength conversion layer 11 may be a layer in which phosphor particles are dispersed in a transparent resin. The wavelength conversion layer 11 is typically formed to cover the LED element 2 and the reflective layer 21. The wavelength conversion layer 11 receives light (excitation light) emitted from the LED element 2 to yield fluorescence. Mixture of excitation light and fluorescence provides a desired color of light from the LED device 100. When, for example, the light from the LED element 2 is blue and the fluorescence emitted from the phosphor contained in the wavelength conversion layer 11 is yellow, the light from the LED device 100 turns white.

The transparent resin contained in the wavelength conversion layer 11 is not limited to particular resins, and may be for example, a silicone resin, an epoxy resin, or the like.

The phosphor particles contained in the wavelength conversion layer 11 may be excited by the light emitted from the LED element 2 to yield fluorescence having a different wavelength from the light emitted from the LED element 2. For example, examples of phosphor particles emitting yellow fluorescence include an yttrium aluminum garnet (YAG) phosphor. The YAG phosphor receives blue light (wavelength 420 nm to 485 nm) emitted from a blue LED element to yield yellow fluorescence (wavelength 550 nm to 650 nm).

The phosphor particles are obtained by, for example, the following procedure: 1) mixing a material mixture having a predetermined composition with a proper amount of flux (fluoride, such as ammonium fluoride), and pressing the mixture to form a compact; and 2) placing the resulting compact in a crucible and firing the compact in the air in a temperature range of from 1,350° C. to 1,450° C. for two to five hours to give a sintered compact.

The material mixture having a predetermined composition is obtained by mixing well oxides of Y, Gd, Ce, Sm, Al, La, Ga, and the like or compounds that are easily converted into oxides at high temperature at a stoichiometric ratio. Alternatively, the material mixture having a predetermined composition is obtained by the following procedure: 1) mixing oxalic acid with a solution where the rare earth elements of Y, Gd, Ce, and Sm are dissolved in an acid at a stoichiometric ratio to give coprecipitated oxides; and 2) mixing the coprecipitated oxides with aluminum oxide or gallium oxide.

The type of phosphor is not limited to YAG phosphor, and may be other phosphors, such as non-garnet phosphor free of Ce.

The average particle size of the phosphor particles is preferably from 1 μm to 50 μm, more preferably 10 μm or less. The phosphor particles with a larger particle size have higher luminous efficiency (wavelength conversion efficiency). On the other hand, the phosphor particles with an excessively large particle size produce large gaps generated in the interface between the phosphor particles and the transparent resin (epoxy resin or silicone resin). This tends to reduce the strength of the wavelength conversion layer 11 or allow gas to enter from the outside of the LED device 100 toward the LED element 2. The average particle size of the phosphor particles can be measured, for example, by the Coulter counter method.

The amount of the phosphor particles in the wavelength conversion layer 11 is typically from 5% to 15% by mass with respect to the total mass of solid contents in the wavelength conversion layer. The thickness of the wavelength conversion layer 11 is typically from 25 µm to 5 mm.

The wavelength conversion layer 11 is obtained by preparing a composition for forming the wavelength conversion layer, in which the phosphor particles are dispersed in the transparent resin; applying the composition onto the LED element 2 and the reflective layer 21 with a dispenser or the like; and then curing the composition for forming the wavelength conversion layer.

2. Coating Liquid

The coating liquid used for producing the reflective layer 21 of the LED device 100A will be described. The coating liquid contains a white pigment and a polysiloxane precursor (a monomer of the above silane compound or its oligomer). The decrease in reflectance of light with a wavelength of 500 nm of the reflective layer, which is a cured layer of the coating liquid, after storage at 180° C. for 1,000 hours is 10% or less, preferably 5% or less, more preferably 2% or less of the reflectance before storage at 180° C. as described above.

The reflective layer, which is a cured layer of the coating liquid, has no glass transition point in the range of from −70° C. to 150° C. The glass transition point of the reflective layer is measured with a thermomechanical analyzer by heating from −100° C. at a rate of 10° C./min.

The coating liquid contains a polysiloxane precursor (the above silane compound or its oligomer) and a white pigment. The coating liquid may optionally contain an organic solvent, water, the above-mentioned metal oxide microparticles, inorganic particles, a clay mineral, a silane coupling agent, a metal alkoxide, and a metal chelate.

In particular, the presence of inorganic particles in the coating liquid tends to increase the viscosity of the coating liquid to improve the coating properties of the coating liquid. The amount of the inorganic particles in the coating liquid is preferably from 0.1% to 10% by mass, more preferably 0.2% to 5% by mass with respect to the total amount of the coating liquid. The coating liquid containing 0.1% by mass or more of the inorganic particles is likely to have improved viscosity.

The coating liquid preferably contains at least one clay mineral selected from the group consisting of laminar silicate minerals, imogolite, and allophane. These particles have a very large surface area. These particles easily form a card house structure in the coating liquid in a static state. The formation of a card house structure by clay minerals significantly increases the viscosity of the coating liquid. However, the card house structure is easily damaged by application of a certain pressure, which reduces the viscosity of the coating liquid. In other words, when the coating liquid contains a clay mineral, the coating liquid has an increased viscosity in a static state and application of a certain pressure reduces the viscosity of the coating liquid. That is, the presence of a clay mineral in the coating liquid makes difficult precipitation of the white pigment in the coating liquid in a static state and thus facilitates application of the coating liquid with a coating machine during coating.

The amount of the clay mineral in the coating liquid is preferably from 0.1% to 5% by mass, more preferably from 0.2% to 2% by mass with respect to the entire coating liquid. An insufficient amount of the clay mineral makes it difficult to increase the viscosity of the coating liquid and thus leads to easy precipitation of the white pigment. In contrast, an excessive amount of the clay mineral results in significant high viscosity of the coating liquid, resulting in uneven discharge of the coating liquid from a coating machine.

Suitable organic solvents in the coating liquid include monohydric alcohols and dihydric and other polyhydric alcohols. The presence of a monohydric alcohol improves the wetting and spreading of a coating film to facilitate application of the coating liquid. On the other hand, the presence of a polyhydric alcohol in the coating liquid tends to increase the viscosity of the coating liquid, which makes difficult the precipitation of the white pigment.

Examples of monohydric alcohols include methanol, ethanol, propanol, and butanol. The amount of the monohydric alcohol is preferably from 10% to 50% by mass, more preferably from 20% to 40% by mass with respect to the entire coating liquid.

The polyhydric alcohol may be either diol or triol. Examples of polyhydric alcohols include ethylene glycol, propylene glycol, diethylene glycol, glycerol, 1,3-butanediol, and 1,4-butanediol. Suitable polyhydric alcohols are ethylene glycol, propylene glycol, 1,3-butanediol, and 1,4-butanediol. The amount of the polyhydric alcohol in the coating liquid is preferably from 10% to 50% by mass, more preferably 20% to 40% by mass with respect to the entire coating liquid.

The coating liquid may contain water. The presence of water in the coating liquid allows water to enter between layers of the clay mineral to cause swelling of the clay mineral, which easily increases the viscosity of the coating liquid.

(Method of Preparing Coating Liquid)

The preparation of the coating liquid is not limited to particular methods, and may involve mixing a white pigment and a polysiloxane precursor (the above silane compound or its oligomer) and optionally an organic solvent, water, metal oxide microparticles, inorganic particles, a clay mineral, a silane coupling agent, and the like together or separate times.

Preferably, the white pigment is dispersed with the following device at least one time in order to increase the dispersibility of the white pigment. The dispersion of the white pigment with the following device reduces aggregation of the pigment particles, which easily provides a finer reflective layer having a high reflectance.

Preferably, either or both of the inorganic particles and the clay mineral are first dispersed in an organic solvent or water with the following device and the rest of components is next mixed in order to increase the viscosity of the coating liquid.

Examples of devices for mixing a mixture or dispersing components include magnetic stirrers, ultrasonic dispersers, homogenizers, stirrer mills, blade kneading stirring devices, thin-film spin type dispersers, high-pressure impact dispersers, planetary centrifugal mixers.

Specific examples of stirring devices include media-less stirrers, such as ULTRA-TURRAX (available from IKA Japan K.K.), TK Homo Mixer (available from PRIMIX Corporation), TK Pipeline-Homo Mixer (available from PRIMIX Corporation), TK Filmix (available from PRIMIX Corporation), Cleamix (available from M Technique Co., Ltd.), Clea SS5 (available from M Technique Co., Ltd.), Cavitron (available from Eurotech Co., Ltd.), and Fine Flow Mill (available from Pacific Machinery & Engineering Co., Ltd.); media stirrers, such as Visco Mill (available from AIMEX Co., Ltd.), APEX Mill (available from Kotobuki Industries Co., Ltd.), Star Mill (available from Ashizawa Finetech Ltd.), DMPA-S Super Flow (available from Nippon Eirich Co., Ltd.), MP Mill (available from Inoue Mfg. Inc.), Spike Mill (available from Inoue Mfg. Inc.), Mighty Mill (available from Inoue Mfg. Inc.), and SC Mill (available from Mitsui Mining Co., Ltd.); high-pressure impact dispersers, such as Ultimizer (available from Sugino Machine Limited), Nanomizer (available from Yoshida Kikai co., ltd.), and NANO 3000 (available from Beryu corp.). Stirring devices also include planetary centrifugal mixers, such THINKY Mixer (Thinky Corporation), and ultrasonic dispersers.

(Application Method and Curing Method)

A method of applying the above coating liquid is not limited to particular methods, and may be, for example, an application method using ordinal coating machines, such as dispensers, jet dispensers, and sprayers. A method of curing the coating liquid and the curing conditions are appropriately selected according to the type of polysiloxane precursor or the like. Heat curing is one of curing methods.

(Usage of Coating Liquid)

A film formed from the above coating liquid is resistant to cracks, and further the reflectance of the film is unlikely to decrease even after exposure of the film to high temperature. The above coating liquid is thus suitable as a coating liquid for forming the reflective layer in the LED device, and the coating liquid can be used in any applications that can take advantage of such properties.

3. Other Embodiments

The present invention is described above by way of the embodiments, the description and drawings that form a part of this disclosure should not be construed as limiting the present invention. Various alternative embodiments, examples, operating techniques will be apparent to a person skilled in the art from this disclosure.

Figure 3:
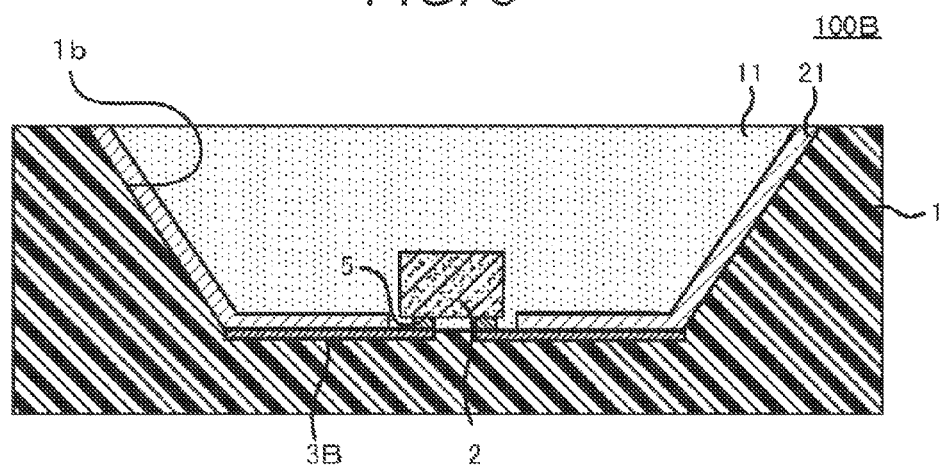
FIG. 3 is a cross-sectional view of another exemplary LED device of the present invention.

The LED device 100A can have various configurations, without limitation. The LED element 2 is limited to a wire-bonding type and may be, for example, a flip chip type connected to a metal part (metal electrode part) 3B disposed on a substrate 1 through a projected electrode 5, as illustrated in FIG. 3. The cavity illustrated in FIG. 1 and FIG. 2 may have, for example, a truncated pyramidal shape, cylindrical shape, prismatic shape, without limitation.

Figure 4:
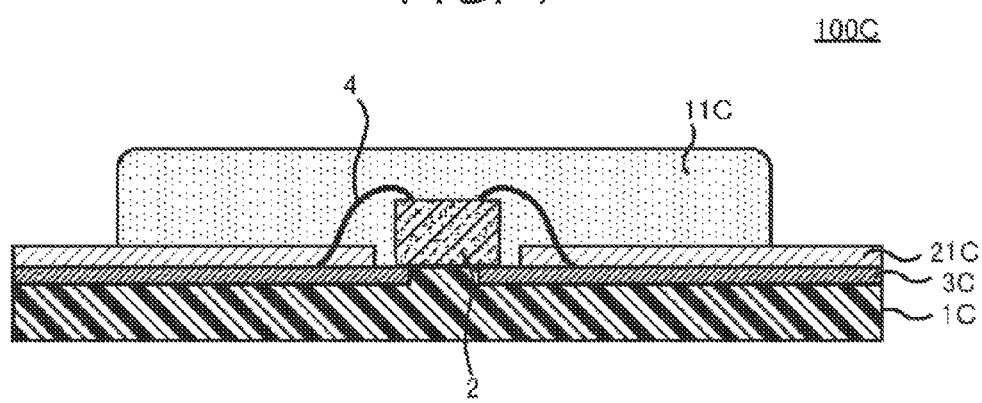
FIG. 4 is a cross-sectional view of another exemplary LED device of the present invention.
Figure 5:
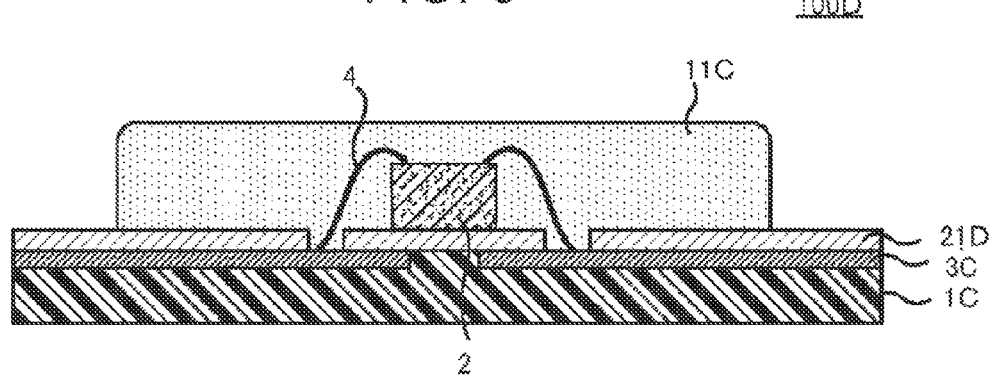
FIG. 5 is a cross-sectional view of another exemplary LED device of the present invention.

Furthermore, the substrate 1 may be, for example, a plate-like substrate 1C, as illustrated in FIG. 4 and FIG. 5.

For example, as illustrated in FIG. 5, the reflective layer 21D may be formed not only in the area around the LED element 2, but also in the area between the substrate 1C and the LED element 2. That is, the LED element 2 may be disposed on the reflective layer 21D. The formation of the reflective layer 21D between the substrate 1C and the LED element 2 allows light going to the back side of the LED element 2 to be reflected on the reflective layer 21D and accordingly increases the light extraction efficiency from the LED device 100D.

Figure 6:
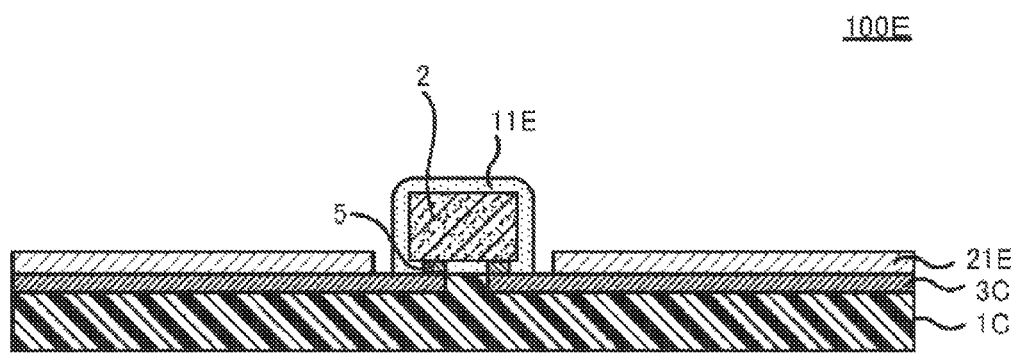
FIG. 6 is a cross-sectional view of another exemplary LED device of the present invention.

As illustrated in FIG. 6, the reflective layer 21E is not necessarily covered with the wavelength conversion layer 11E. The LED device may have a wavelength conversion layer 11E that covers at least the LED element 2.

It should be understood that various embodiments and the like that are not described herein are included in the present invention. Therefore, the technical scope of the present invention is defined only by the matters specifying the claimed inventions according to the claims reasonable for the above description.

EXAMPLES

Preparation of Silane Compound Solution

Silane compound solutions containing polysiloxane precursors (oligomers) were prepared by mixing bifunctional silane compounds, trifunctional silane compounds, tetrafunctional silane compounds, water, acids (catalysts), and the like at the following compositions. Furthermore, polysiloxanes obtained by heat-curing (polymerizing) the polysiloxane precursors (oligomers) at 150° C. were subjected to solid Si-NMR measurement. The ratio of bifunctional silicon to the total amount of silicon in the polysiloxane was then calculated. The ratio is shown in Table 1.

(Silane Compound Solution 1)

Mixed were 3.2% by mass of tetramethoxysilane, 6.8% by mass of methyltrimetoxysilane, 35% by mass of methanol, 35% by mass of acetone, 19.99% by mass of water, and 0.01% by mass of nitric acid, followed by stirring at 23° C. for three hours. The mixture was then reacted with stirring at 26° C. for three days to give a silane compound solution 1 containing a polysiloxane precursor (oligomer).

The molecular weight of the resulting oligomer was measured by GPC to find that the weight average molecular weight on a polystyrene basis was 1,800.

This solution was cured at 150° C. to produce a solid specimen. According to the solid Si-NMR measurement of the specimen, the peaks corresponding to the Q and T components were observed and no peak for the D component was observed.

(Silane Compound Solution 2)

Mixed were 4.33% by mass of tetraethoxysilane, 2.85% by mass of methyltrimetoxysilane, 2.82% by mass of dimethyldimethoxysilane, 70% by mass of methanol, 19.99% by mass of water, and 0.01% by mass of nitric acid, followed by stirring at 23° C. for three hours. The mixture was then reacted with stirring at 26° C. for three days to give a silane compound solution 2 containing a polysiloxane precursor (oligomer).

The molecular weight of the resulting oligomer was measured by GPC to find that the weight average molecular weight on a polystyrene basis was 2,000.

This solution was cured at 150° C. to produce a solid specimen. According to the solid Si-NMR measurement of the specimen, the peaks corresponding to the Q, T, and D components were observed. The ratio of bifunctional silicon to the total amount of silicon in the polysiloxane was 36% by mass.

(Silane Compound Solution 3)

Mixed were 4% by mass of tetraethoxysilane, 2.63% by mass of methyltrimetoxysilane, 3.37% by mass of dimethyldimethoxysilane, 70% by mass of methanol, 19.99% by mass of water, and 0.01% by mass of nitric acid, followed by stirring at 23° C. for three hours. The mixture was then reacted with stirring at 26° C. for three days to give a silane compound solution 3 containing a polysiloxane precursor (oligomer).

The molecular weight of the resulting oligomer was measured by GPC to find that the weight average molecular weight on a polystyrene basis was 1,800.

This solution was cured at 150° C. to produce a solid specimen. According to the solid Si-NMR measurement of the specimen, the peaks corresponding to the Q, T, and D components were observed. The ratio of bifunctional silicon to the total amount of silicon in the polysiloxane was 42.1% by mass.

(Silane Compound Solution 4)

Mixed were 3.56% by mass of tetraethoxysilane, 2.34% by mass of methyltrimetoxysilane, 4.1% by mass of dimethyldimethoxysilane, 70% by mass of methanol, 19.99% by mass of water, and 0.01% by mass of nitric acid, followed by stirring at 23° C. for three hours. The mixture was then reacted with stirring at 26° C. for three days to give a silane compound solution 4 containing a polysiloxane precursor (oligomer).

The molecular weight of the resulting oligomer was measured by GPC to find that the weight average molecular weight on a polystyrene basis was 1,700.

This solution was cured at 150° C. to produce a solid specimen. According to the solid Si-NMR measurement of the specimen, the peaks corresponding to the Q, T, and D components were observed. The ratio of bifunctional silicon to the total amount of silicon in the polysiloxane was 49.9% by mass.

(Silane Compound Solution 5)

Mixed were 2.81% by mass of tetraethoxysilane, 5.55% by mass of methyltrimetoxysilane, 1.64% by mass of dimethyldimethoxysilane, 70% by mass of methanol, 19.99% by mass of water, and 0.01% by mass of hydrochloric acid. The mixture was reacted with stirring at 25° C. for three days to give a silane compound solution 5 containing a polysiloxane precursor (oligomer).

The molecular weight of the resulting oligomer was measured by GPC to find that the weight average molecular weight on a polystyrene basis was 1,800.

This solution was cured at 150° C. to produce a solid specimen. According to the solid Si-NMR measurement of the specimen, the peaks corresponding to the Q, T, and D components were observed. The ratio of bifunctional silicon to the total amount of silicon in the polysiloxane was 20.1% by mass.

(Silane Compound Solution 6)

Mixed were 4% by mass of tetraethoxysilane, 5.2% by mass of methyltrimetoxysilane, 0.8% by mass of dimethyldimethoxysilane, 70% by mass of methanol, 19.99% by mass of water, and 0.01% by mass of hydrochloric acid. The mixture was reacted with stirring at 25° C. for three days to give a silane compound solution 6 containing a polysiloxane precursor (oligomer).

The molecular weight of the resulting oligomer was measured by GPC to find that the weight average molecular weight on a polystyrene basis was 1,600.

This solution was cured at 150° C. to produce a solid specimen. According to the solid Si-NMR measurement of the specimen, the peaks corresponding to the Q, T, and D components were observed. The ratio of bifunctional silicon to the total amount of silicon in the polysiloxane was 10.4% by mass.

(Silane Compound Solution 7)

Methyltriethoxysilane (15% by mass) is dissolved in 80% by mass of ethylene glycol dimethyl ether, followed by stirring. Next, a mixture of 4.99% by mass of pure water and 0.01% by mass of concentrated nitric acid was added dropwise with slow stirring and stirred for about three hours. The mixture was allowed to stand at room temperature for six days to give a solution. This solution was vacuum distilled at 120 to 140 mmHg and 40° C. for 1 hour to give a silane compound solution 7.

The molecular weight of a polysiloxane precursor (oligomer) in the resulting solution was measured by GPC to find that the weight average molecular weight on a polystyrene basis was 1,800.

This solution was cured at 150° C. to produce a solid specimen. According to the solid Si-NMR measurement of the specimen, only the peak corresponding to the T component was observed and no peak corresponding to the D component was observed.

TABLE 1

| | Tetrafunctional Component | | | Trifunctional Component | | | Bifunctional Component | | |
|---|---|---|---|---|---|---|---|---|---|
| | Compound | Molar Fraction in Silane | Mass % in Solution | Compound | Molar Fraction in Silane | Mass % in Solution | Compound | Molar Fraction in Silane | Mass % in Solution |
| Silane Compound Solution 1 | Tetramethoxysilane | 29.6 | 3.2 | Methyltrimetoxysilane | 70.4 | 6.8 | — | — | — |
| Silane Compound Solution 2 | Tetraethoxysilane | 31.9 | 4.33 | Methyltrimetoxysilane | 32.1 | 2.85 | Dimethyldimethoxysilane | 36.0 | 2.82 |
| Silane Compound Solution 3 | Tetraethoxysilane | 28.9 | 4 | Methyltrimetoxysilane | 29.0 | 2.63 | Dimethyldimethoxysilane | 42.1 | 3.37 |
| Silane Compound Solution 4 | Tetraethoxysilane | 25.0 | 3.56 | Methyltrimetoxysilane | 25.1 | 2.34 | Dimethyldimethoxysilane | 49.9 | 4.1 |
| Silane Compound Solution 5 | Tetraethoxysilane | 19.9 | 2.81 | Methyltrimetoxysilane | 60.0 | 5.55 | Dimethyldimethoxysilane | 20.1 | 1.64 |
| Silane Compound Solution 6 | Tetraethoxysilane | 30.0 | 4 | Methyltrimetoxysilane | 59.6 | 5.2 | Dimethyldimethoxysilane | 10.4 | 0.8 |

TABLE 1-continued

| | | | | | | |
|---|---|---|---|---|---|---|
| Silane Compound Solution 7 | — | — | — | Methyltrimetoxysilane | 100.0 | 15 | — | | — | |

| | | Solvent | | Water | Acid | | Mass Ratio of |
|---|---|---|---|---|---|---|---|
| | | Type | Mass % in Solution % | Mass % in Solution % | Type | Mass % in Solution % | Bifunctional Silicon to Total Silicon |
| | Silane Compound Solution 1 | Methanol/Acetone (1/1) | 70 | 19.99 | Nitric Acid | 0.01 | 0.0 |
| | Silane Compound Solution 2 | Methanol | 70 | 19.99 | Nitric Acid | 0.01 | 36.0 |
| | Silane Compound Solution 3 | Methanol | 70 | 19.99 | Nitric Acid | 0.01 | 42.1 |
| | Silane Compound Solution 4 | Methanol | 70 | 19.99 | Nitric Acid | 0.01 | 49.9 |
| | Silane Compound Solution 5 | Methanol | 70 | 19.99 | Hydrochloric Acid | 0.01 | 20.1 |
| | Silane Compound Solution 6 | Methanol | 70 | 19.99 | Hydrochloric Acid | 0.01 | 10.4 |
| | Silane Compound Solution 7 | Ethylene Glycol Dimethyl Ether | 80 | 4.99 | Concentrated Nitric Acid | 0.01 | 0.0 |

(Preparation of Adjustment Liquid)

Adjustment liquids were prepared by mixing metal oxide microparticles, inorganic particles, a clay mineral, and a silane coupling agent at the proportions shown in Table 2. The abbreviations in Table 2 mean the following components. Methods of mixing and stirring the adjustment liquids were described in Table 2.

(Solvent)
BD: 1,3-Butanediol
PG: Propylene glycol
IPA: Isopropyl alcohol
EtOH: Ethanol (Metal Oxide Microparticles)
ZR-210: $ZrO_2$ particles (TECNADIS-Zr-210, available from TECNAN), average particle size 10 to 15 nm
Ti-210: $TiO_2$ particles (TECNADIS-TI-210, available from TECNAN), average particle size 10 to 15 nm (Inorganic Particles)
Sylysia 470: Silica (Sylysia 470, available from Fuji Silysia Chemical Ltd.), average particle size 14 μm
SP-1: Silica (Micro bead SP-1, available from JGC Catalysts and Chemicals Ltd.), average particle size 5 μm (Clay Mineral)
MK-100: Synthetic mica (Micro Mica MK-100, available from Co-op Chemical Co., Ltd.)
ME-100: Synthetic mica (Somasif ME-100, available from Co-op Chemical Co., Ltd.)
SWN: Smectite (Lucentite SWN, available from Co-op Chemical Co., Ltd.)

(Silane Coupling Agent)
KBM-403: 3-glycidoxypropyltrimethoxysilane (KBM-403, available from Shin-etsu silicone)
KBM-903: 3-aminopropyltrimethoxysilane (KBM-903, available from Shin-etsu silicone)
KBM-802: 3-mercaptopropylmethyldimethoxysilane (KBM-802, available from Shin-etsu silicone)

TABLE 2

| | Solvent | | | | Metal Oxide Microparticles | | Inorganic Particles | | Clay Mineral | |
|---|---|---|---|---|---|---|---|---|---|---|
| | BD | PG | IPA | EtOH | ZR-210 | Ti-210 | Sylysia 470 | SP-1 | MK-100 | ME-100 |
| Adjustment Liquid 1 | 100 | | | | | | | | | |
| Adjustment Liquid 2 | 55 | | 40 | | 5 | | | | | |
| Adjustment Liquid 3 | 67 | | 30 | | | | 3 | | | |
| Adjustment Liquid 4 | | 70 | 25 | | | | | | 5 | |
| Adjustment Liquid 5 | | 70 | 28 | | | | | | | |
| Adjustment Liquid 6-1 | 26 | 26 | | 45 | | | | 3 | | |
| Adjustment Liquid 6-2 | 26 | 26 | | 45 | | | | 3 | | |

TABLE 2-continued

| | | | | | | |
|---|---|---|---|---|---|---|
| Adjustment Liquid 7-1 | 62 | | 34 | | | 3 |
| Adjustment Liquid 7-2 | 62 | | 34 | | | 3 |
| Adjustment Liquid 8-1 | 40 | 20 | 35 | | 5 | |
| Adjustment Liquid 8-2 | 40 | 20 | 35 | | 5 | |
| Adjustment Liquid 8-3 | 40 | 20 | 35 | | 5 | |
| Adjustment Liquid 84 | 40 | 20 | 35 | | 5 | |
| Adjustment Liquid 9 | 80 | | | 17 | | |
| Adjustment Liquid 10 | 60 | | | 32 | 4 | |
| Adjustment Liquid 11 | 60 | | | 32 | 4 | |

| | Clay Mineral | | | Silane Coupling Agent | | | Mixing/Stirring Method |
|---|---|---|---|---|---|---|---|
| | SWN | Allophane | Imogolite | KBM-403 | KBM-903 | KBM-802 | |
| Adjustment Liquid 1 | | | | | | | — |
| Adjustment Liquid 2 | | | | | | | Sonication |
| Adjustment Liquid 3 | | | | | | | THINKY Mixer |
| Adjustment Liquid 4 | | | | | | | Specs Mill |
| Adjustment Liquid 5 | | | | 2 | | | Stirrer |
| Adjustment Liquid 6-1 | | | | | | | Homo Mixer |
| Adjustment Liquid 6-2 | | | | | | | Filmix |
| Adjustment Liquid 7-1 | | | | | 1 | | Clea Mix |
| Adjustment Liquid 7-2 | | | | | 1 | | Ultimizer |
| Adjustment Liquid 8-1 | | | | | | | Nanomizer |
| Adjustment Liquid 8-2 | | | | | | | Stirrer |
| Adjustment Liquid 8-3 | | | | | | | Homo Mixer |
| Adjustment Liquid 84 | | | | | | | Ultimizer |
| Adjustment Liquid 9 | 3 | | | | | | Homo Mixer |
| Adjustment Liquid 10 | | 3 | | | | 1 | Homo Mixer |
| Adjustment Liquid 11 | | | 3 | | | 1 | Nanomizer |

Examples 1 to 16 and Comparative Example 1

Coating liquids were prepared by mixing a white pigment, a silane compound solution, and an adjustment liquid at the mixing ratios shown in Table 3.

Specifically, a white pigment (A) and a silane compound solution (B) prepared by the above-mentioned method were mixed, followed by mixing and dispersion by the method described in the following Table 3. Then, an adjustment liquid (C) prepared by the above-mentioned method was mixed with the mixture of the white pigment (A) and the silane compound solution (B), followed by mixing and dispersion by the method described in the following Table 3.

The abbreviations in Table 3 mean the following components.

(White Pigment)

Titanium oxide: CR-93 available from Ishihara Sangyo Kaisha, Ltd.

Aluminum oxide: HD-11 available from Nikkato Corporation

Zinc oxide: FINEX 50A available from Sakai Chemical Industry Co., Ltd.

Barium sulfate: NFJ-3-1999 available from Sansei Co., Ltd.

Boron nitride: AP-100S available from MARUKA CORPORATION., LTD

Example 17

As described in Table 3, a coating liquid was prepared by mixing all a white pigment, a silane compound solution, and an adjustment liquid at the mixing ratio indicated in Table 3 and stirring the mixture with Homo Mixer.

Example 18

As described in Table 3, a coating liquid was prepared by mixing all a white pigment, a silane compound solution, and an adjustment liquid at the mixing ratio indicated in Table 3 and stirring the mixture with Nanomizer.

Comparative Example 2

A coating liquid was prepared by mixing and stirring 60% by mass of titanium oxide (CR-93, available from Ishihara Sangyo Kaisha, Ltd.) and 40% by mass of methyl silicone resin (SCR-1016, available from Shin-etsu silicone) with a planetary centrifugal mixer (THINKY Mixer, available from Thinky Corporation).

Comparative Example 3

A coating liquid was prepared by mixing and stirring 60% by mass of titanium oxide (CR-93, available from Ishihara Sangyo Kaisha, Ltd.) and 40% by mass of phenyl silicone resin (KER-4000-UV, available from Shin-etsu silicone) with a planetary centrifugal mixer (THINKY Mixer, available from Thinky Corporation).

Comparative Example 4

A coating liquid was prepared by mixing and stirring 60% by mass of titanium oxide (CR-93, available from Ishihara Sangyo Kaisha, Ltd.) and 40% by mass of epoxy resin (W0917, available from Daicel Corporation) with a planetary centrifugal mixer (THINKY Mixer, available from Thinky Corporation).

TABLE 3

| | White Pigment (A) | | Silane Compound Solution (B) | | Adjustment Liquid (C) | | Mixing/Dispersing Method | | | |
|---|---|---|---|---|---|---|---|---|---|---|
| | Trade Name | Mass % | Silane Compound Solution | Mass % | Adjustment Liquid | Mass % | A | B | C | Final |
| Example 1 | CR-93 | 25 | Silane Compound Solution 1 | 62 | Adjustment Liquid 1 | 13 | Sonication | — | | Stirrer |
| Example 2 | CR-93 | 25 | Silane Compound Solution 1 | 50 | Adjustment Liquid 2 | 25 | Sonication | Sonication | | Stirrer |
| Example 3 | CR-93 | 24 | Silane Compound Solution 1 | 52 | Adjustment Liquid 3 | 24 | Sonication | THINKY Mixer | | Stirrer |
| Example 4 | CR-93 | 25 | Silane Compound Solution 1 | 50 | Adjustment Liquid 4 | 25 | Sonication | Specs Mill | | Stirrer |
| Example 5 | CR-93 | 23 | Silane Compound Solution 1 | 52 | Adjustment Liquid 5 | 25 | Sonication | Stirrer | | Stirrer |
| Example 6 | CR-93 | 53 | Silane Compound Solution 1 | 36 | Adjustment Liquid 6-1 | 11 | Stirrer | Homo Mixer | | Stirrer |
| Example 7 | CR-93 | 63 | Silane Compound Solution 1 | 24 | Adjustment Liquid 6-2 | 13 | Homo Mixer | Filmix | | Stirrer |
| Example 8 | CR-93 | 8 | Silane Compound Solution 1 | 80 | Adjustment Liquid 7-1 | 12 | Specs Mill | Clea Mix | | Stirrer |
| Example 9 | CR-93 | 8 | Silane Compound Solution 1 | 58 | Adjustment Liquid 7-2 | 34 | Stirrer | Ultimizer | | Stirrer |
| Example 10 | HD-11 | 25 | Silane Compound Solution 1 | 50 | Adjustment Liquid 8-1 | 25 | Filmix | Nanomizer | | Stirrer |
| Example 11 | NFJ-3-1999 | 25 | Silane Compound Solution 1 | 50 | Adjustment Liquid 8-2 | 25 | Homo Mixer | Stirrer | | Stirrer |
| Example 12 | 50A | 25 | Silane Compound Solution 1 | 50 | Adjustment Liquid 8-3 | 25 | THINKY Mixer | Stirrer | | Stirrer |
| Example 13 | AP-100S | 25 | Silane Compound Solution 1 | 20 | Adjustment Liquid 8-4 | 55 | Ultimizer | Homo Mixer | | Stirrer |
| Example 14 | CR-93 | 10 | Silane Compound Solution 2 | 65 | Adjustment Liquid 1 | 25 | Nanomizer | — | | Stirrer |
| Example 15 | CR-93 | 10 | Silane Compound Solution 3 | 65 | Adjustment Liquid 1 | 25 | Sonication | — | | Stirrer |
| Comparative Example 1 | CR-93 | 10 | Silane Compound Solution 4 | 65 | Adjustment Liquid 1 | 25 | Sonication | — | | Stirrer |
| Example 16 | CR-93 | 45 | Silane Compound Solution 5 | 40 | Adjustment Liquid 9 | 15 | Sonication | — | | Stirrer |
| Example 17 | CR-93 | 32 | Silane Compound Solution 6 | 48 | Adjustment Liquid 10 | 20 | | | Homo Mixer | |
| Example 18 | CR-93 | 20 | Silane Compound Solution 7 | 48 | Adjustment Liquid 11 | 32 | | | Nanomizer | |
| Comparative Example 2 | CR-93 | 60 | Methyl Silicone Resin | 40 | — | | | | THINKY Mixer | |
| Comparative Example 3 | CR-93 | 60 | Phenyl Silicone Resin | 40 | — | | | | THINKY Mixer | |
| Comparative Example 4 | CR-93 | 60 | Epoxy Resin | 40 | — | | | | THINKY Mixer | |

| | Concentration in Solid Contents of Coating Liquid (Mass %) | | | | | |
|---|---|---|---|---|---|---|
| | White Pigment | Silane Compound | Metal Oxide Microparticles | Inorganic Particles | Clay Mineral | Silane Coupling Agent |
| Example 1 | 80.1 | 19.9 | 0.0 | 0.0 | 0.0 | 0.0 |
| Example 2 | 80.0 | 16.0 | 16.0 | 0.0 | 0.0 | 0.0 |
| Example 3 | 80.2 | 17.4 | 0.0 | 10.0 | 0.0 | 0.0 |
| Example 4 | 80.0 | 16.0 | 0.0 | 0.0 | 16.0 | 0.0 |
| Example 5 | 80.1 | 18.1 | 0.0 | 0.0 | 0.0 | 0.7 |
| Example 6 | 93.1 | 6.3 | 0.0 | 5.3 | 0.0 | 0.0 |
| Example 7 | 95.8 | 3.6 | 0.0 | 4.6 | 0.0 | 0.0 |
| Example 8 | 48.5 | 48.5 | 0.0 | 0.0 | 18.2 | 6.1 |
| Example 9 | 52.8 | 38.3 | 0.0 | 0.0 | 19.8 | 6.6 |
| Example 10 | 80.0 | 16.0 | 16.0 | 0.0 | 0.0 | 0.0 |
| Example 11 | 80.0 | 16.0 | 16.0 | 0.0 | 0.0 | 0.0 |
| Example 12 | 80.0 | 16.0 | 16.0 | 0.0 | 0.0 | 0.0 |
| Example 13 | 84.0 | 6.7 | 16.8 | 0.0 | 0.0 | 0.0 |
| Example 14 | 60.6 | 39.4 | 0.0 | 0.0 | 0.0 | 0.0 |
| Example 15 | 60.6 | 39.4 | 0.0 | 0.0 | 0.0 | 0.0 |
| Comparative Example 1 | 60.6 | 39.4 | 0.0 | 0.0 | 0.0 | 0.0 |
| Example 16 | 91.0 | 8.1 | 0.0 | 0.0 | 6.1 | 0.0 |
| Example 17 | 83.3 | 12.5 | 10.4 | 0.0 | 7.8 | 2.6 |
| Example 18 | 67.2 | 24.2 | 13.4 | 0.0 | 10.1 | 3.4 |

TABLE 3-continued

| | | | | | | |
|---|---|---|---|---|---|---|
| Comparative Example 2 | 60.0 | 0.0 | 0.0 | 0.0 | 0.0 | 0.0 |
| Comparative Example 3 | 60.0 | 0.0 | 0.0 | 0.0 | 0.0 | 0.0 |
| Comparative Example 4 | 60.0 | 0.0 | 0.0 | 0.0 | 0.0 | 0.0 |

[Evaluation Method and Measurement Method]

Evaluation on Reflective Layer

The rate of decrease in reflectance after storage at 180° C. for 1,000 hours and the glass transition point were measured for reflective layers formed from the coating liquids. The results are shown in Table 4.

(Initial Reflectance, Rate of Decrease in Reflectance after Storage at 180° C. For 1,000 Hours)

The coating liquids prepared in Examples and Comparative Examples were applied to transparent glass plates (1 mm). The coating liquids were cured by heating at 150° C. for one hour to give measurement samples having a reflective layer with a thickness of 25 μm.

For these measurement samples, the reflectance of light with a wavelength of 500 nm was measured with a V-670 spectrophotometer (available from JASCO Corporation), and the obtained value was provided as the initial reflectance (reflectance A).

Next, these samples were placed in an oven at 180° C. and stored for 1,000 hours. The reflectance (reflectance B) of light with a wavelength of 500 nm was then measured. The rate of decrease in reflectance of the reflective layer after storage at 180° C. for 1,000 hours was calculated according to the following formula.

Rate of Decrease (%)=[(Reflectance $A$−Reflectance $B$)/Reflectance $A$]×100

The initial reflectance was evaluated as follows.

○: 95% or more

Δ: 90% or more and less than 95%

(Measurement of Glass Transition Point)

The coating liquids prepared in Examples and Comparative Examples were applied to transparent glass plates (1 mm). The coating liquids were cured by heating at 150° C. for one hour to give measurement samples having a reflective layer with a thickness of 25 μm. The glass transition point of the resulting reflective layer was measured with Q400EM (available from TA Instruments) by heating from −100° C. at a rate of 10° C./min according to the TMA method based on JIS K7197.

Evaluation on LED Device

LED devices were prepared using the coating liquids according to the following method. The thermal resistance of the LED devices, peeling of the LED devices from an aluminum substrate, and peeling of a silicone material from the LED devices were evaluated. The results are shown in Table 4.

(Method of Producing LED Device)

A package was prepared in which one blue LED element (rectangular parallelepiped shape; 200 μm×300 μm×100 μm) was flip-chip mounted in the center of an accommodation unit of a circular package (substrate) (opening diameter: 3 mm, diameter of bottom: 2 mm, angle of wall surface: 60°) having metallic wiring.

The coating liquids prepared above in Examples and Comparative Examples were applied to the area other than a chip mounting area with a dispenser. The coating liquid was heated in an oven at 150° C. for one hour to form a reflective layer.

Furthermore, 10% by mass of a YAG phosphor was mixed in methyl silicone (KER-2500 available from Shin-Etsu Chemical Co., Ltd.) with degassing to give a composition for a wavelength conversion layer. The composition for a wavelength conversion layer was applied to a recess of the above-mentioned LED element with a dispenser and heated at 150° C. for one hour to provide an LED device.

(Thermal Resistance Test for LED Device (Rate of Decrease in Thermal Resistance at 180° C.)

Each LED device was heated at 180° C. for 1,000 hours, and the thermal resistance of the LED device was evaluated by comparing the total luminous flux after testing with the total luminous flux before testing. The value of the total luminous flux of each LED device was measured with a spectral radiance meter (CS-1000A, available from Konica Minolta Sensing) while the LED device was allowed to emit light at an electric current value of 20 mA.

The results were evaluated as follows.

○: The ratio of the total luminous flux to the initial luminous flux (total luminous flux after testing/total luminous flux before testing) is 0.95 or more.

Δ: The ratio of the total luminous flux to the initial luminous flux (total luminous flux after testing/total luminous flux before testing) is 0.90 or more and less than 0.95.

x: The ratio of the total luminous flux to the initial luminous flux (total luminous flux after testing/total luminous flux before testing) is less than 0.90.

(Peel Test 1 (Evaluation on Contact with Aluminum Substrate after Heat Shock Testing)

The coating liquids prepared above in Examples and Comparative Examples were applied to aluminum substrates. The coating liquids were cured by heating at 150° C. for one hour to give measurement samples having a reflective layer with a thickness of 25 μm. The contact between the reflective layer and the aluminum substrate in these measurement samples was evaluated after 100 cycles of 150° C. for 30 minutes and −40° C. for 30 minutes.

The contact was evaluated after repeating a work of pasting and immediate peeling of Nichiban Sellotape (registered trademark) (24 mm) to/from the reflective layer 20 times. After each work, the conditions of the reflective layer were observed under a microscope and evaluated as follows.

⊙: The peeling of the reflective layer was not observed and nothing was found on the surface of the tape after 20 cycles of the work.

○: The peeling of the reflective layer was not observed after 15 cycles of the work, but the peeling was observed after 20 cycles of the work.

Δ1: The peeling of the reflective layer was not observed after 10 cycles of the work, but the peeling was generated after 15 cycles of the work.

Δ2: The peeling was not generated after 15 cycles of the work, but a small amount of the white pigment was found on the surface of the tape after one cycle of the work.

x: The reflective layer had been peeled at the tenth cycle of the work.

(Peel Test 2 (Evaluation on Contact with Silicone Resin after Heat Shock Testing)

Onto the reflective layer of the samples that had caused no peeling in Peel Test 1 described above, a methyl silicone resin (KER-2500 available from Shin-Etsu Chemical Co., Ltd.) was applied in a thickness of 1 mm, and cured by heating at 150° C. for one hour.

The contact between the reflective layer and the silicone resin layer in the samples was evaluated after 100 cycles of 150° C. for 30 minutes and −40° C. for 30 minutes.

The contact was evaluated after repeating a work of pasting and immediate peeling of Nichiban Sellotape (registered trademark) (24 mm) to/from the silicone resin layer 20 times. After each work, the conditions of the silicone layer were observed under a microscope and evaluated as follows.

⊙: The peeling of the silicone layer was not observed even after 20 cycles of the work.

○: The peeling of the silicone layer was not observed after 15 cycles of the work, but the peeling was observed after 20 cycles of the work.

Δ: The peeling of the silicone layer was observed after 10 cycles of the work, but the peeling was observed after 15 cycles of the work.

TABLE 4

| | Concentration in Solid Contents (Mass %) | | | | | | Evaluation Results for Reflective Layer | | | Evaluation Results for LED Device | | |
|---|---|---|---|---|---|---|---|---|---|---|---|---|
| | White Pigment | Polysiloxane | Metal Oxide Microparticles | Inorganic Particles | Clay Mineral | Silane Coupling Agent | Initial Reflectance | Rate (%) of Decrease in Reflectance after 1,000 Hours at 180° C. | Glass Transition Point (° C.) | Evaluation on Decrease in Total Luminous Flux of LED at 180° C. | Peeling From Aluminum Substrate after Heat Shock | Peeling of Silicone after Heat Shock |
| Example 1 | 80.1 | 19.9 | 0.0 | 0.0 | 0.0 | 0.0 | ○ | 2 | 200° C. or More | ○ | ○ | ○ |
| Example 2 | 80.0 | 16.0 | 16.0 | 0.0 | 0.0 | 0.0 | ○ | 1 | 200° C. or More | ○ | ⊙ | ⊙ |
| Example 3 | 80.2 | 17.4 | 0.0 | 10.0 | 0.0 | 0.0 | ○ | 2 | 200° C. or More | ○ | ⊙ | ○ |
| Example 4 | 80.0 | 16.0 | 0.0 | 0.0 | 16.0 | 0.0 | ○ | 2 | 200° C. or More | ○ | ⊙ | ○ |
| Example 5 | 80.1 | 18.1 | 0.0 | 0.0 | 0.0 | 7.0 | ○ | 2 | 200° C. or More | ○ | ⊙ | ○ |
| Example 6 | 93.1 | 6.3 | 0.0 | 5.3 | 0.0 | 0.0 | ○ | 2 | 200° C. or More | ○ | ⊙ | ○ |
| Example 7 | 95.8 | 3.6 | 0.0 | 4.6 | 0.0 | 0.0 | ○ | 2 | 200° C. or More | ○ | Δ2 | Δ |
| Example 8 | 48.5 | 48.5 | 0.0 | 0.0 | 18.2 | 6.1 | Δ | 2 | 200° C. or More | ○ | ⊙ | ○ |
| Example 9 | 52.8 | 38.3 | 0.0 | 0.0 | 19.8 | 6.6 | ○ | 2 | 200° C. or More | ○ | ⊙ | ○ |
| Example 10 | 80.0 | 16.0 | 16.0 | 0.0 | 0.0 | 0.0 | ○ | 2 | 200° C. or More | ○ | ⊙ | ⊙ |
| Example 11 | 80.0 | 16.0 | 16.0 | 0.0 | 0.0 | 0.0 | ○ | 2 | 200° C. or More | ○ | ⊙ | ⊙ |
| Example 12 | 80.0 | 16.0 | 16.0 | 0.0 | 0.0 | 0.0 | ○ | 2 | 200° C. or More | ○ | ⊙ | ⊙ |
| Example 13 | 84.0 | 6.7 | 16.8 | 0.0 | 0.0 | 0.0 | ○ | 2 | 200° C. or More | ○ | ⊙ | ⊙ |
| Example 14 | 60.6 | 39.4 | 0.0 | 0.0 | 0.0 | 0.0 | ○ | 2 | 180° C. | ○ | ○ | ○ |
| Example 15 | 60.6 | 39.4 | 0.0 | 0.0 | 0.0 | 0.0 | ○ | 3 | 160° C. | ○ | Δ1 | ○ |
| Comparative Example 1 | 60.6 | 39.4 | 0.0 | 0.0 | 0.0 | 0.0 | ○ | 4 | 140° C. | Δ | X | ○ |
| Example 16 | 91.0 | 8.1 | 0.0 | 0.0 | 6.1 | 0.0 | ○ | 2 | 200° C. or More | ○ | ⊙ | ○ |
| Example 17 | 83.3 | 12.5 | 10.4 | 0.0 | 7.8 | 2.6 | ○ | 2 | 200° C. or More | ○ | ⊙ | ⊙ |
| Example 18 | 67.2 | 24.2 | 13.4 | 0.0 | 10.1 | 3.4 | ○ | 2 | 200° C. or More | ○ | ⊙ | ⊙ |
| Comparative Example 2 | 60.0 | 0.0 | 0.0 | 0.0 | 0.0 | 0.0 | ○ | 7 | 40° C. | Δ | X | — |
| Comparative Example 3 | 60.0 | 0.0 | 0.0 | 0.0 | 0.0 | 0.0 | ○ | 12 | −60° C. | X | X | — |
| Comparative Example 4 | 60.0 | 0.0 | 0.0 | 0.0 | 0.0 | 0.0 | ○ | 20 | 154° C. | X | ○ | ○ |

(Evaluation Results)

It was found that, when the decrease in reflectance after storage of the reflective layer at 180° C. for 1,000 hours was 10% or more (Comparative Examples 3 and 4), the LED device including the reflective layer had reduced thermal resistance, and the decrease in total luminous flux of the LED device after the thermal resistance test was not acceptable.

Comparative Examples 1, 2, and 3 showed that, when the reflective layer had a glass transition point in the range of from −70° C. to 150° C., the contact between the aluminum substrate and the reflective layer became deteriorated in the heat shock test for the LED device.

Example 15 showed that, when the ratio of bifunctional silicon to the total amount of silicon in the polysiloxane was more than 40% by mass, the contact between the reflective layer and the silicone layer became deteriorated in the heat shock test for the LED device.

Examples 2 to 5 showed that, when the reflective layer contained any of metal oxide microparticles, inorganic particles, and a clay mineral, the contact between the reflective layer and the metal substrate became closer to improve the peel strength. Example 2 showed that the reflective layer containing particularly metal oxide microparticles improves the contact with the silicone resin. Example 8 showed that the reflective layer with a low content of a white pigment had a reduced reflectance. Example 7 showed that the reflective layer with an excessively high content of a white pigment resulted in an insufficient amount of a binder (polysiloxane), which tended to release powder from the surface. In addition, Examples 5, 8, 9, 17, and 18 and the like showed that the reflective layer containing a silane coupling agent provided closer contact between the reflective layer and the aluminum substrate to increase the peel strength.

REFERENCE SIGNS LIST 1, 1C Substrate
2 LED element
11, 11C, 11D, 11E Wavelength conversion layer
21, 21C, 21D, 21E Reflective layer
100A, 100B, 100C, 100D, 100E LED device

The invention claimed is:

1. An LED device comprising:
a substrate;
an LED element disposed on the substrate; and
a reflective layer disposed at least around the LED element on the substrate,
wherein the reflective layer contains a white pigment and a polysiloxane,
the rate of decrease in reflectance of light with a wavelength of 500 nm of the reflective layer after storage of the reflective layer at 180° C. for 1,000 hours is 10% or less of the reflectance before storage at 180° C., and
the reflective layer has no glass transition point in a range of from −70° C. to 150° C., wherein the amount of bifunctional silicon in the polysiloxane is 40% by mass or less with respect to the total amount of silicon in the polysiloxane.

2. The LED device according to claim 1, wherein the reflective layer further contains metal oxide microparticles.

3. The LED device according to claim 2, wherein the metal oxide microparticles have a smaller average particle size than the white pigment.

4. The LED device according to claim 1, wherein the reflective layer further contains inorganic particles.

5. The LED device according to claim 1, wherein the reflective layer further contains a clay mineral.

6. The LED device according to claim 5, wherein the clay mineral contains at least one selected from the group consisting of laminar clay minerals, allophane, and imogolite.

7. The LED device according to claim 1, wherein the reflective layer further contains a silane coupling agent.

8. The LED device according to claim 1, wherein the white pigment is at least one selected from the group consisting of titanium oxide, aluminum oxide, barium sulfate, zinc oxide, and boron nitride.

9. The LED device according to claim 1, wherein the amount of the white pigment in the reflective layer is 50% by mass or more and 95% by mass or less.

10. The LED device according to claim 1, wherein the reflective layer is disposed on the substrate other than the area where the LED element is disposed.

11. The LED device according to claim 1, wherein the reflective layer is formed between the substrate and the LED element.

* * * * *